(12) United States Patent
Zhu

(10) Patent No.: US 10,948,733 B2
(45) Date of Patent: Mar. 16, 2021

(54) SYSTEMS, METHODS, AND DEVICES FOR DETECTING MAGNETO-OPTIC KERR EFFECT

(71) Applicant: THE REGENTS OF THE UNIVERSITY OF CALIFORNIA, Oakland, CA (US)

(72) Inventor: Xiangdong Zhu, Davis, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 12 days.

(21) Appl. No.: 16/408,437

(22) Filed: May 9, 2019

(65) Prior Publication Data

US 2019/0346267 A1    Nov. 14, 2019

Related U.S. Application Data

(60) Provisional application No. 62/669,289, filed on May 9, 2018.

(51) Int. Cl.
*G01C 19/72* (2006.01)
*G02B 27/09* (2006.01)
(Continued)

(52) U.S. Cl.
CPC ....... *G02B 27/0994* (2013.01); *G01R 15/243* (2013.01); *G02B 27/0977* (2013.01);
(Continued)

(58) Field of Classification Search
CPC ... G01C 19/72; G02F 1/03; G02F 1/07; G02F 1/01; G02F 1/21; G02B 27/14;
(Continued)

(56) References Cited

U.S. PATENT DOCUMENTS 5,631,559 A * 5/1997 Oliver .................... G01B 11/18
324/175
5,994,898 A * 11/1999 DiMarzio .......... G01R 33/0325
324/142

(Continued)

*Primary Examiner* — Mohamed K Amara
(74) *Attorney, Agent, or Firm* — Park, Vaughan, Fleming & Dowler LLP

(57) ABSTRACT

The technology of a zero loop-area oblique-incidence Sagnac interferometer and methods of using the Sagnac interferometer to detect magneto-optic Kerr effect is disclosed. An example apparatus includes: a light source configured to generate an optical beam; a beam splitter; a polarizer configured to separate the optical beam into two orthogonal components; a modulator configured to phase-modulating at least one of the two orthogonal components to produce a modulated pair of orthogonal components; a polarization dependent delay optics configured to direct the modulated pair of orthogonal components toward a surface of a sample to cause the modulated pair of orthogonal components to incident on the surface at an oblique angle; a mirror configured to reflecting the modulated pair of orthogonal components back towards the beam splitter; a photo receiver configured to receive a return beam redirected by the beam splitter; and a phase-sensitive detector.

22 Claims, 15 Drawing Sheets

(51) Int. Cl.
  *G02F 1/03*    (2006.01)
  *G02B 27/14*   (2006.01)
  *G02F 1/07*    (2006.01)
  *G01R 15/24*   (2006.01)

(52) U.S. Cl.
  CPC ............... *G02B 27/14* (2013.01); *G02F 1/03* (2013.01); *G02F 1/07* (2013.01)

(58) Field of Classification Search
  CPC ........... G02B 27/0977; G02B 27/0994; G02B 27/0905; G02B 27/283; G02B 6/0006; G01R 33/0325; G01R 15/243; G01B 11/0641; G01B 2290/70; G01J 3/0218
  See application file for complete search history.

(56) References Cited

U.S. PATENT DOCUMENTS

| | | | | |
|---|---|---|---|---|
| 6,650,682 B1 * | 11/2003 | Diels | ............ | G01C 19/66 372/25 |
| 6,778,279 B2 * | 8/2004 | Lange | ............ | G01B 11/16 356/483 |
| 6,836,334 B2 * | 12/2004 | Bennett | ............ | G01C 19/72 356/460 |
| 7,166,997 B2 * | 1/2007 | Ju | ............ | G01R 33/0325 324/244.1 |
| 7,733,497 B2 * | 6/2010 | Yun | ............ | G01B 9/02083 356/497 |
| 7,742,173 B2 * | 6/2010 | Yun | ............ | G01N 21/4795 356/479 |
| 7,911,621 B2 * | 3/2011 | Motaghiannezam | ............ | G01B 9/02078 356/477 |
| 7,995,210 B2 * | 8/2011 | Tearney | ............ | G01B 9/02004 356/479 |
| 2003/0043697 A1 * | 3/2003 | Vakoc | ............ | G01D 5/35383 367/149 |
| 2007/0268545 A1 * | 11/2007 | Gluckstad | ............ | G02B 21/14 359/237 |
| 2009/0212769 A1 * | 8/2009 | Stoica | ............ | G01R 33/1284 324/244.1 |
| 2012/0001625 A1 * | 1/2012 | Yamada | ............ | G01R 33/0322 324/244.1 |
| 2015/0378243 A1 * | 12/2015 | Kippelen | ............ | G02F 1/0126 359/244 |
| 2019/0383614 A1 * | 12/2019 | Feke | ............ | G01C 19/721 |

* cited by examiner

15000

```
┌─────────────────────────────────────────────┐
│ directing an optical beam from a light source into │
│ a polarizer to separate the optical beam into two  │ — 1501
│ orthogonal components;                             │
└─────────────────────────────────────────────┘
                        ↓
┌─────────────────────────────────────────────┐
│ phase-modulating at least one of the two           │
│ orthogonal components to produce a modulated       │ — 1503
│ pair of orthogonal components                      │
└─────────────────────────────────────────────┘
                        ↓
┌─────────────────────────────────────────────┐
│ directing the modulated pair of orthogonal         │
│ components, using polarization dependent delay     │
│ optics, towards a surface of a sample to cause the │ — 1505
│ modulated pair of orthogonal components to         │
│ incident on the surface at an oblique angle;       │
└─────────────────────────────────────────────┘
                        ↓
┌─────────────────────────────────────────────┐
│ reflecting, using an objective-and-mirror device,  │
│ the modulated pair of orthogonal components       │ — 1507
│ back towards the light source;                     │
└─────────────────────────────────────────────┘
                        ↓
┌─────────────────────────────────────────────┐
│ combining the modulated pair of orthogonal         │
│ components to produce a modified optical beam;     │ — 1509
└─────────────────────────────────────────────┘
                        ↓
┌─────────────────────────────────────────────┐
│ Determining a non-reciprocal phase in              │
│ accordance with the optical beam and the           │ — 1511
│ modified optical beam.                             │
└─────────────────────────────────────────────┘
```

FIG. 15

SYSTEMS, METHODS, AND DEVICES FOR DETECTING MAGNETO-OPTIC KERR EFFECT

RELATED APPLICATION

This application claims the benefit of U.S. Provisional Patent Application Ser. No. 62/669,289, filed May 9, 2019, entitled "systems, methods, and devices for detecting magneto-optic Kerr effect," where is hereby incorporated by reference in its entirety.

TECHNICAL FIELD

The present disclosure generally related to systems, methods, and devices for detecting magneto-optic Kerr effect, and more specifically to zero loop-area oblique-incidence Sagnac interferometers and methods for using the Sagnac interferometer to detect magneto-optic Kerr effect.

BACKGROUND

Optical detection of magnetic and chiral properties in materials has played an indispensable role in discovery and characterization of novel material phases, mostly for its non-intrusiveness, utility over a wide range of conditions, and compatibility with the concurrent presence of other characterization techniques. Magnetization in a material causes the polarization of an optical beam to change in a way that breaks the time reversal symmetry. Such an effect can be detected in transmission geometry (Faraday Effect) if the sample is sufficiently transparent or in reflection geometry (Kerr Effect) if the sample is opaque or the transmission measurement is not available. In practice the linear birefringence is ubiquitous in materials and elements of optical systems and typically produces a much larger effect on the polarization of the optical beam.

As a result, magneto-optic effects are usually detected by modulating the magnetization and measuring the corresponding polarization change with a suitable method. Such a modulation-based optical detection enables measurements of Kerr rotation as small as $10^{-7}$ radians. When modulating the magnetization in a sample is not feasible, the effect of linear birefringence may be removed, if the magneto-optic effect is measured with a Sagnac interferometer.

An optical beam and its time-reversed counterpart traverse an identical loop-wise path including reflection from a magnetized sample but in the opposite direction. The difference of the phases acquired by these two beams may be measured. Because the linear birefringence produces a common phase (reciprocal), its effect is absent in the differential phase. Yet the magneto-optic effect yields a non-reciprocal phase in the two beams that has the same amplitude but opposite signs. As a result, the differential phase may be twice as large as the non-reciprocal phase acquired by one of the two beams.

SUMMARY

Technologies relating to zero loop-area oblique-incidence Sagnac interferometers and methods for using the Sagnac interferometer to detect magneto-optic Kerr effect are disclosed.

An apparatus, in some implementations, includes: a light source configured to generate an optical beam; a beam splitter; a polarizer configured to separate the optical beam into two orthogonal components; a modulator configured to phase-modulating at least one of the two orthogonal components to produce a modulated pair of orthogonal components; a polarization dependent delay optics configured to direct the modulated pair of orthogonal components toward a surface of a sample to cause the modulated pair of orthogonal components to incident on the surface at an oblique angle; a mirror configured to reflecting the modulated pair of orthogonal components back towards the beam splitter; a photo receiver configured to receive a return beam redirected by the beam splitter; and a phase-sensitive detector.

The apparatus, in some implementations, further includes a wave plate configuration configured to be used to measure longitudinal and polar Kerr, set between the sample and the polarization dependent delay optics and between the sample and the mirror, The wave plate configuration, in some implementations, includes one of the following:

a first quarter wave plate set at 45° between the sample and the polarization dependent delay optics, and a second quarter wave plate set at 0° between the sample and the mirror;

removing any wave plate between the sample and the polarization dependent delay optics, and the second quarter wave plate set at 45° between the sample and the mirror;

a first half wave plate set at 22.5° between the sample and the polarization dependent delay optics, and a second quarter wave plate set at 0° between the sample and the mirror;

the first quarter wave plate set at 45° between the sample and the polarization dependent delay optics, and removing any wave plate between the sample and the mirror; or the first half wave plate set at 22.5° between the sample and the polarization dependent delay optics, and removing any wave plate between the sample and the mirror.

The apparatus, in some implementations, further includes: a first objective configured to focus the two orthogonal components; a first polarization-maintaining fiber configured to transmit the two orthogonal components; a second polarization-maintaining fiber configured to transmit the two orthogonal components, wherein the polarization dependent delay optics includes the second polarization-maintaining fiber; a second objective configured to collimate the modulated pair of orthogonal components and direct the modulated pair of orthogonal components into the sample; a sample stand configured to sustain the sample and to apply the sample with an external magnetic field; and a third objective configured to focus the modulated pair of orthogonal components from the sample and direct toward the mirror and to collimate a return modulated pair of orthogonal components from the mirror.

The return modulated pair of orthogonal components are, in some implementations, recombined to produce the return beam.

The polarizer is, in some implementations, a linear polarizer.

The modulated pair of orthogonal components is, in some implementations, reflected back towards the beam splitter along a same optical path.

The reflecting back towards the beam splitter through the same path in some implementations results in a zero loop-area.

The modulated pair of orthogonal components are, in some implementations, rotated by $\lambda/4$ by using the wave plate configuration.

The phase-sensitive detector is, in some implementations, configured to detecting in-plane and out-of-plane magnetization in the sample by analyzing the photocurrent of a portion of the return beam.

The photo receiver is, in some implementations, a RF photo receiver and is configured to measure an intensity of a portion of the return beam.

A method, in some implementations, includes: directing an optical beam from a light source into a polarizer to separate the optical beam into two orthogonal components; phase-modulating at least one of the two orthogonal components to produce a modulated pair of orthogonal components; directing the modulated pair of orthogonal components, using polarization dependent delay optics, towards a surface of a sample to cause the modulated pair of orthogonal components to incident on the surface at an oblique angle; reflecting, using an objective-and-mirror device, the modulated pair of orthogonal components back towards the light source; combining the modulated pair of orthogonal components to produce a modified optical beam; and determining a non-reciprocal phase in accordance with the optical beam and the modified optical beam.

The polarizer is, in some implementations, a linear polarizer.

The modulated pair of orthogonal components is, in some implementations, reflected back towards the light source along a same optical path.

The reflecting back towards the light source through the same optical path, in some implementations, results in a zero loop-area.

The method, in some implementations, further includes detecting in-plane and out-of-plane magnetizations in the sample.

BRIEF DESCRIPTION OF THE DRAWINGS

FIG. 15 is a flowchart illustrating a method of detecting magneto-optic Kerr effect in accordance with some implementations of the present disclosure.

The implementations disclosed herein are illustrated by way of example, and not by way of limitation, in the figures of the accompanying drawings. Like reference numerals refer to corresponding parts throughout the drawings.

DETAILED DESCRIPTION

Figure 1:
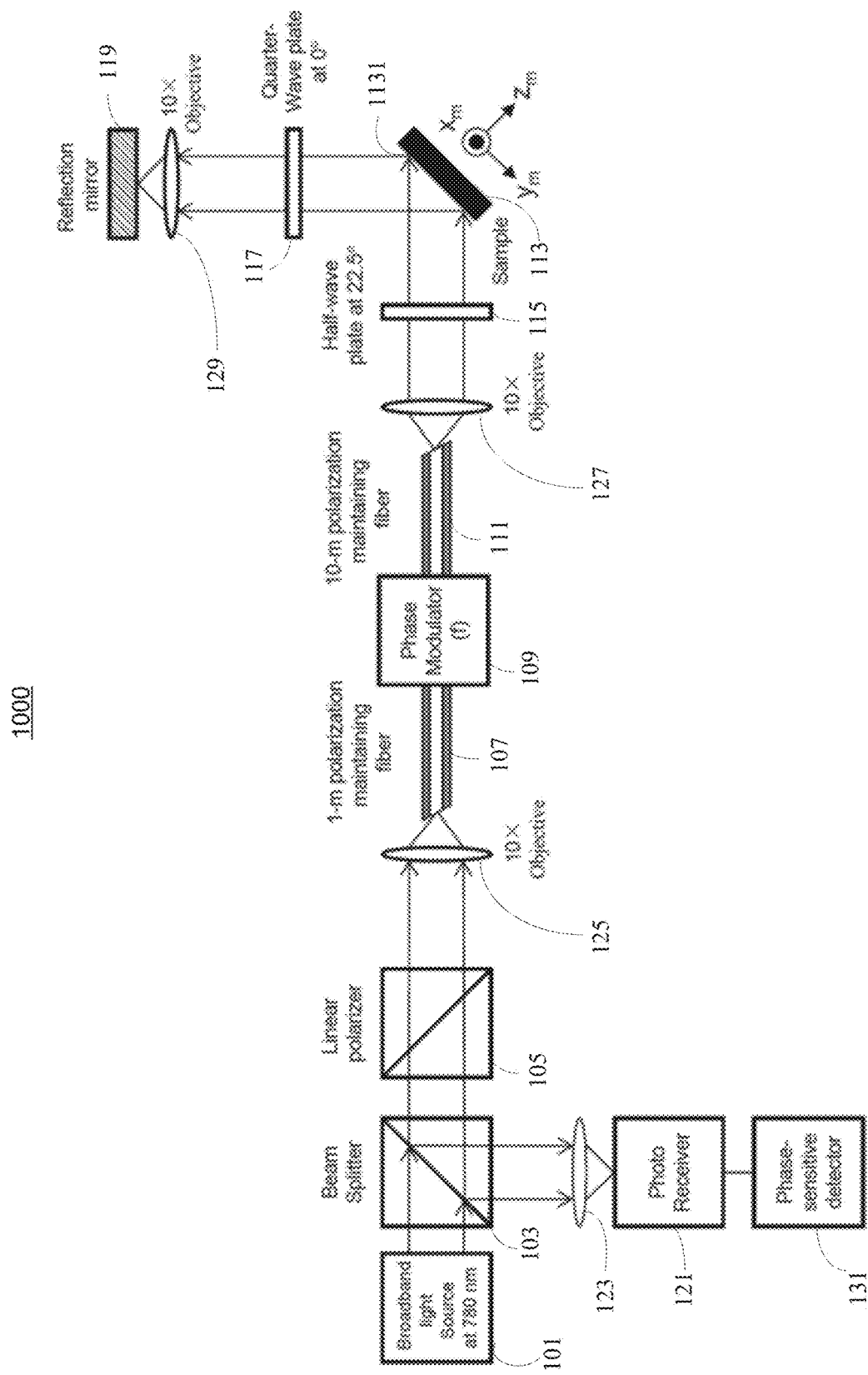
FIG. 1 is a block diagram illustrating one arrangement of a zero loop-area Sagnac interferometer at oblique incidence in accordance with some implementations of the present disclosure.

There are generally two configurations for a Sagnac interferometer: one in which the loop traversed by the two counter-propagating beams encloses a finite area; the other in which the loop encloses zero-area (a.k.a. loop-less). For a finite loop-area Sagnac interferometer, optical beams are produced through beam-splitting optical elements and configured to being either normally incident or obliquely incident on a sample surface so that effects of magnetization along the surface and perpendicular to the surface can both be measured. Because the two beams are steered separately and eventually recombined before detection, more optical elements are needed, making finite loop-area Sagnac interferometers more subject to imperfection and drift in the optical system in addition to the rotational effect. This has limited the sensitivity for Kerr rotation measurement to $1 \times 10^{-6}$ radians. For a zero loop-area Sagnac interferometer, two optical beams are two orthogonally polarized components of the same original beam and thus require no beam splitting and recombination. As a result, such a zero-area Sagnac interferometer can detect Kerr rotation as small as $10^{-7}$ radians without modulating the magnetization. So far though only the normal-incidence geometry has been demonstrated for zero loop-area Sagnac interferometers and in this geometry only the effect from a magnetization perpendicular to the surface can be measured.

The technology of a modified zero loop-area Sagnac interferometer is disclosed. The technologies described in the present disclosure may provide the following technical advantages.

First, the disclosed technology provides a modified zero loop-area Sagnac interferometer in which the optical beams interact with a magnetized sample at oblique incidence such that effects of in-plane magnetization can be detected with same sensitivity as normal incidence Sagnac interferometers, while it further shows that an extra freedom afforded in this modified interferometer enables user to select polarization states of the beam for optimal detection of longitudinal Kerr effects.

Second, the zero loop-area Sagnac interferometer at oblique incidence in the present disclosure shares the general advantage of zero loop-area Sagnac interferometers by using the two orthogonal polarizing components of an optical beam as "the two counter-propagating beams" instead of using two separate beams. This spares the extra optics and complication associated with the beam splitting and recombination that only add to sources of drifts and noise in a Sagnac interferometer.

Third, the oblique-incidence geometry affords multiple configurations for measuring the longitudinal Kerr effect so that one can choose the one configuration that maximizes the signal-to-noise ratio. Compared to finite loop-area Sagnac interferometers at oblique incidence, the zero loop-area Sagnac interferometer at oblique incidence avoids separating and recombining optical beams and thus has much fewer optical elements which also leads to a more stable optical system against drifts.

Fourth and more importantly, the present disclosure has demonstrated that the introduction of the oblique-incidence geometry to such an interferometer enables the detection of the time reversal symmetry breaking (TRSB) effect from an arbitrarily oriented magnetization of a sample in the loop.

Designs of a Zero Loop-Area Sagnac Interferometer at Oblique Incidence

FIG. 1 displays one arrangement of a zero loop-area Sagnac interferometer at oblique incidence in accordance with some implementations of the present disclosure. The arrangement, briefly, is a linearly polarized, collimated broad-band light source 101 centered at 780 nm with a full bandwidth of 30 nm and a power of 6 mW (QPhotonics, Ann Arbor, Mich.) passes through a 50-50 beam splitter (BS) 103 and a linear polarizer (PL) 105 before being focused into a 1-m polarization-maintaining (PM) fiber 107. The transmission axis (TA) of PL 105 is aligned to the initial linear polarization of the optical beam and to the slow-axis (SA) of the 1-m PM fiber 107. The output of the 1-m fiber 105 is connected to the input of an electro-optic modulator (EOM) 109 such that the SA of the fiber bisects the transverse magnetic (TM) and transverse electric (TE) axes of the EOM 109. The EOM 109 is a LiNbO$_3$ phase modulator with V$\pi$=1.3 volts (EOSPACE Inc, Redmond, Wash.). V$\pi$ is the voltage that induces a phase shift of $\pi$ to the TM component of the light beam relative to the TE component of the beam. An f=4.445 MHz sinusoidal voltage wave form with an amplitude of 0.35V is applied to the EOM 109. This causes a phase shift $\Phi(t)=\Phi_0 \cos(2\pi f t)$ to the TM component of the beam with $\Phi_0$=0.85 radians. The output of the EOM 109 is connected to a 10-m PM fiber 111 such that the TM axis of the EOM 109 is aligned to the SA of the fiber. The SA of the 10-m PM fiber 111 at the output is aligned to the p-polarization with respect to the sample 113. After the 10-m PM fiber 111, the beam is collimated with a 10× objective and passes through a half-wave plate (HWP-1) 115 with its SA aligned at 22.5° from the SA of the fiber. The beam is then reflected off the sample at an incidence angle of 50° and passes through a quarter-wave plate (QWP-2) 117 with its SA set parallel to the p-polarization after reflection. To complete the loop-wise path, a mirror 119 is used to send the beam back toward the sample 113 again by first focusing the collimated beam with a 10× objective onto the mirror and then having the reflected beam re-collimated by the same objective before sending it back. After going through the same optics but in a reversed order, 50% of the returned beam with an average power of Pave=4 µW is redirected by the beam splitter (BS) 103 to a 125 MHz photo-receiver 121 (New Focus Model-1801 Newport, Calif.). The latter has a gain of 4×10$^4$ V/A and a responsivity of 0.45 A/Watt at 780 nm. After a calculation based on Jones vectors for the polarization states of the optical beam and Jones matrices for all the optical elements encountered by the beam, the intensity of the beam arriving at the photo-receiver can be shown to vary in time as $$I(t)=\alpha I_{inc}[\beta+J_1(2\gamma\Phi_0)\sin(2\pi f t)\sin(2\theta_K)-J_2(2\gamma\Phi_0)\cos(4\pi f t)\cos(2\theta_K)+\ldots] \quad (1)$$

$\alpha$ is essentially an overall throughput of the interferometer including the reflectance of the sample. $\beta$ is a constant of time near unity. $J_n(2\Phi_0)$ is the n-th Bessel function of the first kind. $\theta_K$ is the Kerr rotation angle proportional to the off-diagonal elements $r_{ps}$ and $r_{sp}$ of the reflection matrix. $\gamma=\sin(\pi f \tau_{round-trip})$ with $\tau_{roundtrip}$ being the time it takes the beam to traverse from the EOM 109 through the 10-m fiber 111 and the rest of the optical elements that follow including the sample 113 and the reflecting mirror 119 and then back to the EOM 109. The modulation frequency of 4.445 MHz is chosen to make $f_{roundtrip}$=0.5 so that $\gamma$ is made to unity. The amplitudes of the first harmonic and the second harmonic are then given by $I(f)=\alpha I_{inc} J_1(2\Phi_0)\sin(2\theta_K)$ and $I(2f)=\alpha I_{inc} J_2(2\Phi_0)\cos(2\theta_K)$. They are measured with an SRS844 lock-in amplifier. Since $\theta_K$ is much smaller than unity, it is extracted from the ratio of the first to the second harmonic as $$\theta_K = \left(\frac{1}{2}\right)\frac{J_2(2\Phi_0)}{J_1(2\Phi_0)}\frac{I(f)}{I(2f)} \quad (2)$$

The choice of $2\Phi_0$=1.7 radians maximizes $J_1(2\Phi_0)$ to 0.58 and yields $J_2(2\Phi_0)$=0.28. For the arrangement show in FIG. 1, the Kerr rotation is caused by the $y_m$-component ($M_y$) and the $z_m$-component ($M_z$) of the magnetization in the sample as follows, $$\theta_K = \theta_{K,L} + \theta_{K,P} = \text{Im}\left\{\frac{2b(r_{pp}-r_{ss})}{r_{pp}^2+r_{ss}^2}M_y\right\} + \text{Im}\left\{\frac{2c(r_{pp}-r_{ss})}{r_{pp}^2+r_{ss}^2}M_z\right\}. \quad (3a)$$

In this arrangement, a is proportional to $|r_{pp}^2+r_{ss}^2|^2$. In the absence of the polar Kerr effect, Equation (3a) is reduced to $$\theta_{K,L} = \text{Im}\left\{\frac{2b(r_{pp}-r_{ss})}{r_{pp}^2+r_{ss}^2}M_y\right\}. \quad (3b)$$

The arrangement in FIG. 1 may be modified to measure the transverse Kerr rotation $\theta_{K,T}$ arising from the $x_m$-component of the magnetization (Mx) in the surface plane and perpendicular to the plane of incidence. This is done by removing the half-wave plate (HWP-1) 115 before the sample 113 and setting the SA of the quarter-wave plate 117 after the sample 113 to 45° from the p-polarization (see FIG. 3). In this geometry, $\theta_{K,T}$ is related to Mx through $$\theta_{K,T} = \text{Im}\left\{\frac{2a}{r_{pp}}M_x\right\}. \tag{4}$$

with parameter a being defined by references. In this arrangement $\alpha$ in Equation (1) is proportional to $|r_{pp}r_{ss}|^2$.

In addition to the capability of measuring Kerr effects arising from all three Cartesian components of magnetization in the sample, there is another advantage of the oblique-incidence zero loop-area Sagnac interferometer over normal-incidence Sagnac interferometers. By consideration of polarization states under symmetry operations of $C_2$ and $\sigma_v$, four combinations of wave plates before and after the sample (including the one shown in FIG. 1) was found that can be used to measure longitudinal Kerr effect. In two of the four combinations, the polarization states are $$P_1 = \frac{1}{\sqrt{2}}\begin{bmatrix}1\\1\end{bmatrix}, \text{ and } P_2 = \frac{1}{\sqrt{2}}\begin{bmatrix}1\\-1\end{bmatrix};$$

in the remaining two combinations, the polarization states are $$P_1 = \frac{1}{\sqrt{2}}\begin{bmatrix}1\\i\end{bmatrix}, \text{ and } P_2 = \frac{1}{\sqrt{2}}\begin{bmatrix}1\\-i\end{bmatrix}.$$

In these four cases, $\theta_K$'s are related to $M_y$ and $M_z$ through different combinations of $r_{pp}$ and $r_{ss}$ and $\alpha$ is proportional to either $|r_{pp}^2 + r_{ss}^2|^2$ or $|r_{pp}^2 - r_{ss}^2|^2$. As a result, depending on reflectivity of a sample, namely $r_{pp}$ and $r_{ss}$, there is the choice to select the one combination out of four that yields the highest signal-to-noise ratio for measuring $M_y$ or $M_z$. For a 42-nm Ni film, the optimal choice for measuring $M_y$ is the one shown in FIG. 1 where $\alpha=|r_{pp}^2+r_{ss}^2|^2 \gg |r_{pp}^2-r_{ss}^2|^2$, and $(r_{pp}-r_{ss})/(r_{pp}^2+r_{ss}^2)$ is the second largest of four combinations. It is important that this option is not available to a normal-incidence zero loop-area Sagnac interferometer.

If the sample only has an out-of-plane magnetization along $z_m$-axis, the optimal choice for measuring $M_z$ (polar Kerr effect) is to remove the quarter wave-plate after the sample and to replace the half-wave plate before the sample with a quarter-wave plate (i.e a first quarter wave plate 715) having its SA set to 45° from the p-polarization (see FIG. 10C). In this case the polar Kerr rotation is given by $$\theta_{K,P} = \text{Im}\left\{\frac{2c(r_{pp}-r_{ss})}{i(r_{pp}^2+r_{ss}^2)}M_z\right\} \tag{5}$$

with $\alpha$ in Equation (1) being again proportional to $|r_{pp}^2 + r_{ss}^2|^2$.

To demonstrate the performance of the zero loop-area oblique-incidence Sagnac interferometer in some implementations of the present disclosure, a longitudinal Kerr rotation and transverse Kerr rotation from a 42-nm Ni film deposited are measured on a silicon wafer. The Ni film has an easy axis of magnetization in the plane of the film. An electromagnet was used to produce a variable magnetic field up to 1,000 Oe either along the $y_m$-axis or the $x_m$-axis in the plane of the film surface. An observation of a longitudinal Kerr effect due to $M_y$ and a transverse Kerr effect due to $M_x$ was the only thing expected.

Figure 2:
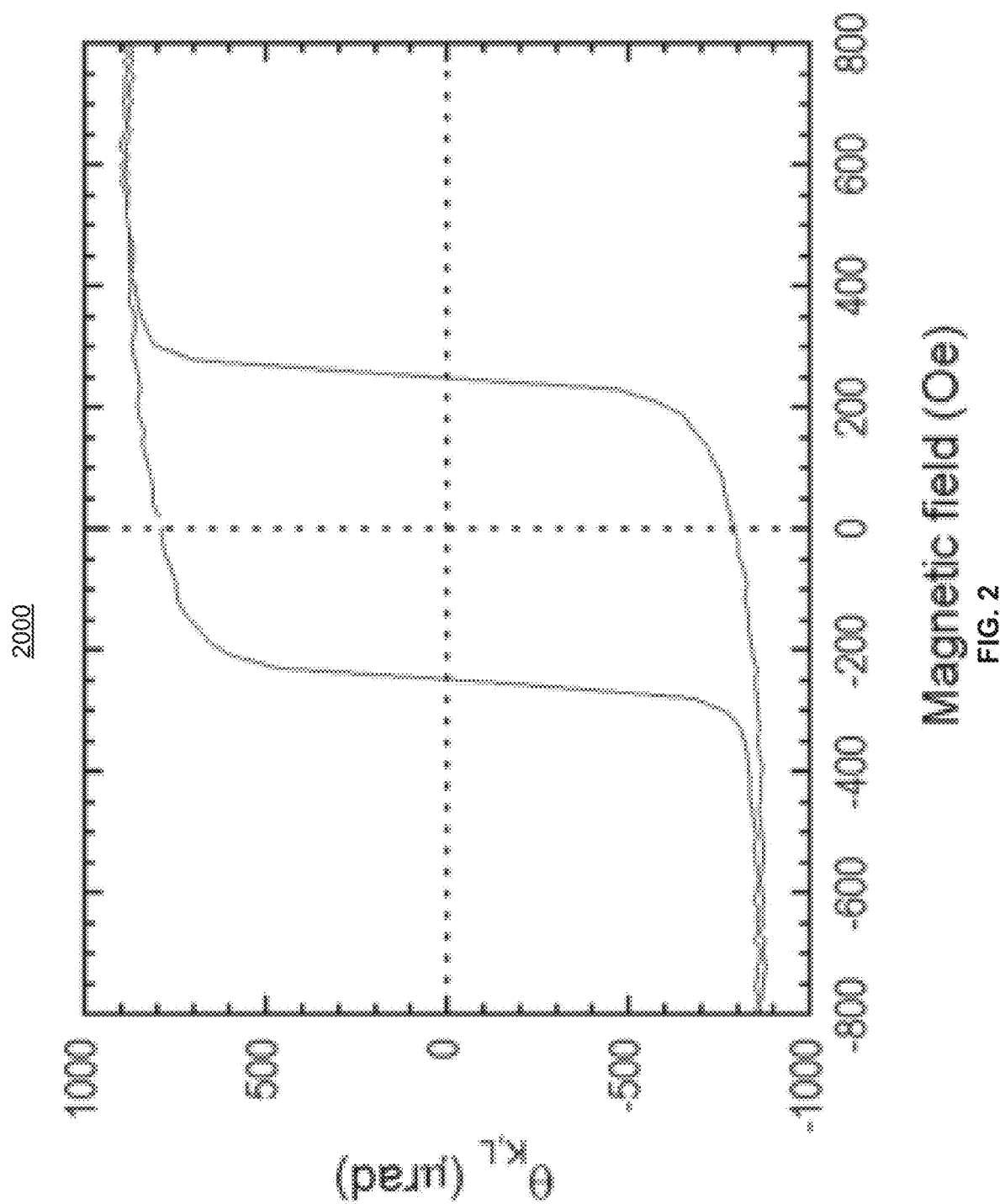
FIG. 2 is a block diagram illustrating a longitudinal Kerr rotation angle from a 42-nm Ni film vs. externally applied magnetic field, measured using the zero loop-area Sagnac interferometer at oblique incidence as shown in FIG. 1.

As shown in FIG. 2, $\theta_{K,L}$ is measured from the Ni film when a magnetic field is applied along the $y_m$-axis of the sample surface 1131 (parallel to the plane of incidence). There are 200 data points in each loop. The magnetic field is changed in steps of ~20 gausses. The rate of change during step-up and step-down is ~20 gauss/sec. After the stepwise change the magnetic field is held for a few seconds before reading the optical signal with the lock-in amplifier with time constant set to $\tau$=1 sec.

Figure 3:
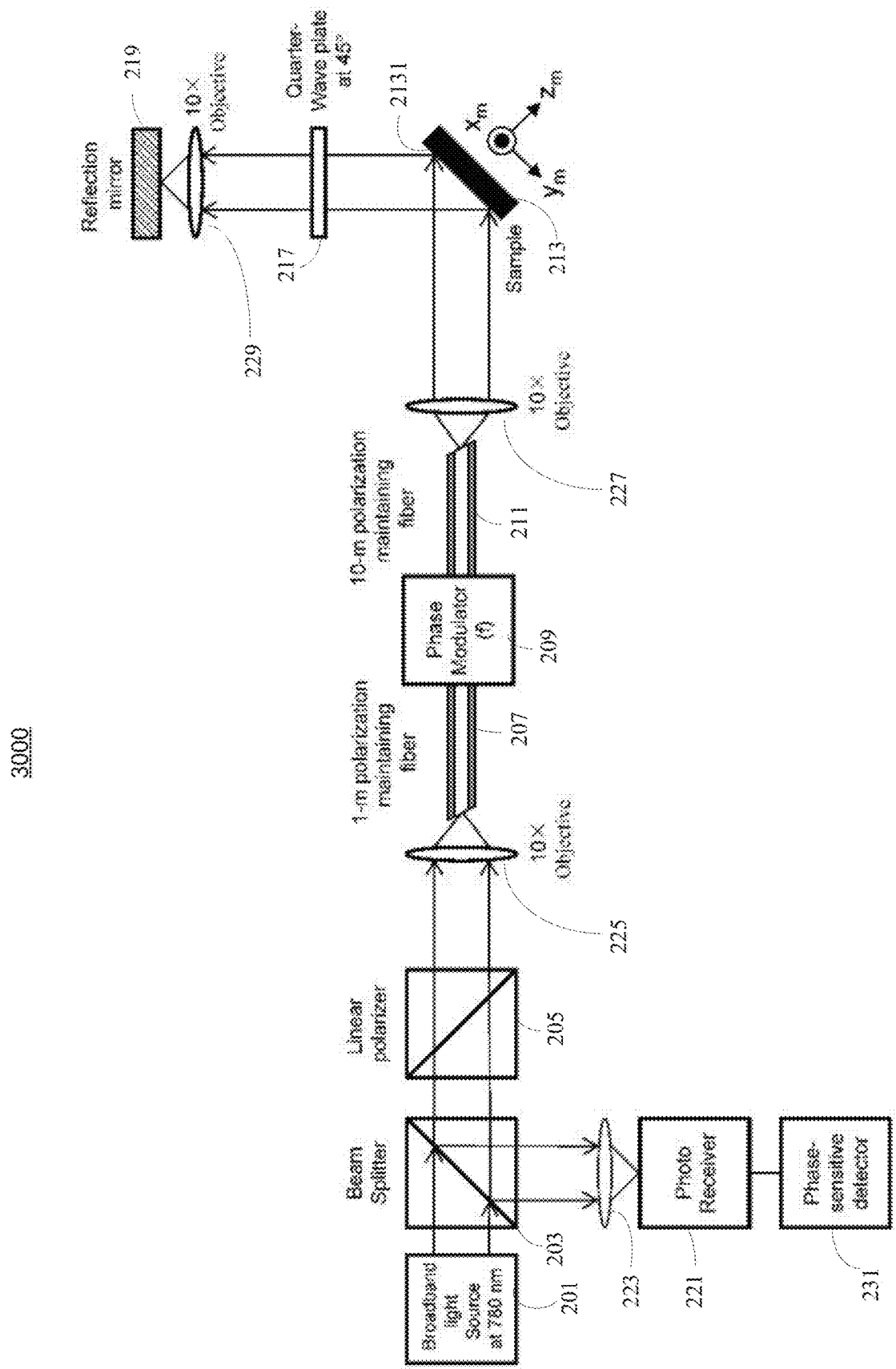
FIG. 3 is a block diagram illustrating a modified arrangement of a zero loop-area Sagnac interferometer for measuring the transverse Kerr rotation angle of a magnetized sample (a 42-nm Ni film on a silicon wafer in this case) in accordance with some implementations of the present disclosure.
Figure 5:
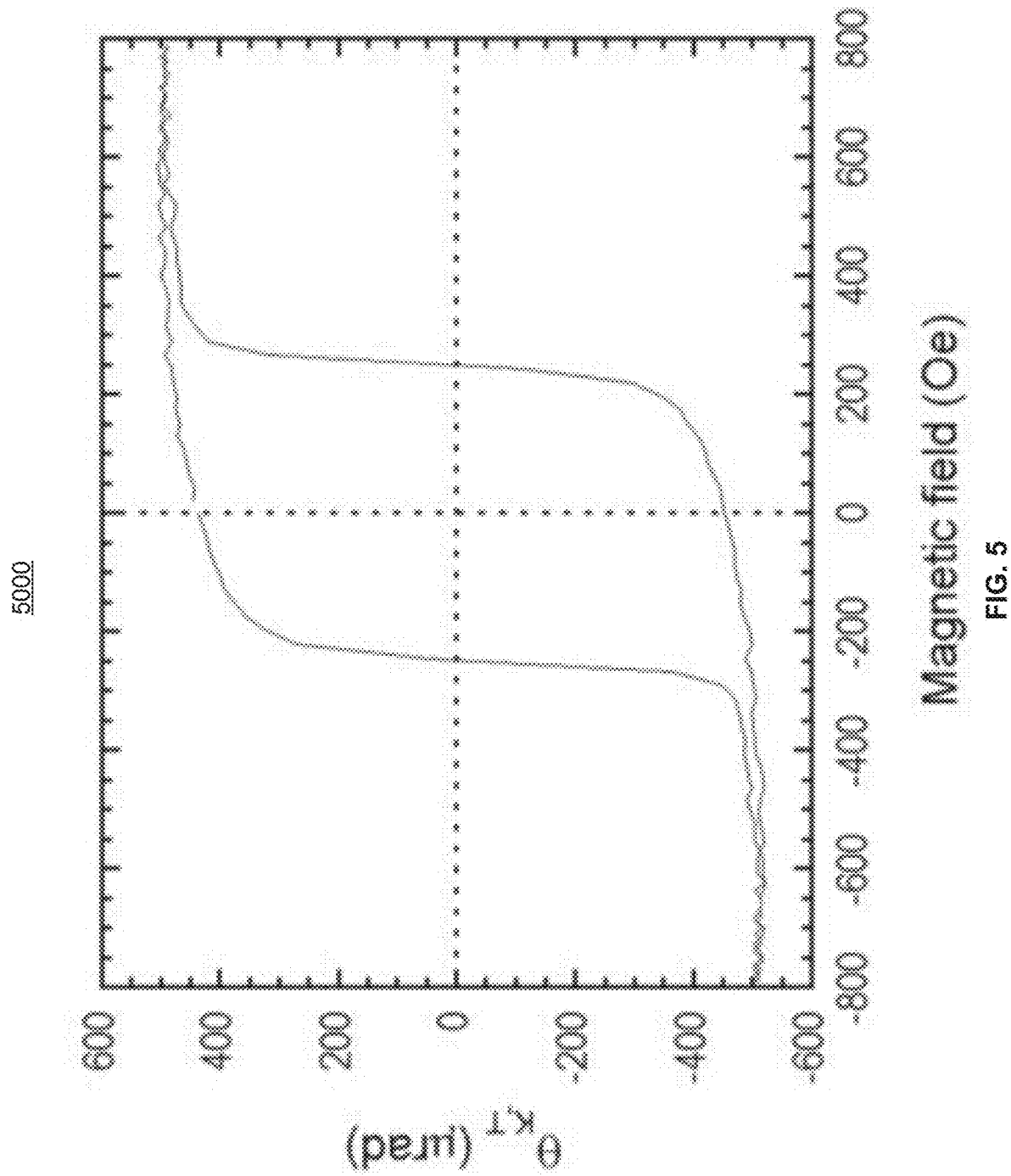
FIG. 5 is a block diagram illustrating transverse Kerr rotation angle from a 42-nm Ni film vs. externally applied magnetic field, measured using a modified zero loop-area Sagnac interferometer at oblique incidence as shown in FIG. 3.

As shown in FIG. 5, $\theta_{K,T}$ is measured from the Ni film when a magnetic field is applied along the $x_m$ axis of the sample surface 2131 (perpendicular to the plane of incidence) with same lock-in amplifier time constant (see the arrangement in FIG. 3). The data shown are collected in single measurement with no multi-cycle averaging nor oversampling within the single loop data. The high quality of these hysteresis loops demonstrates the notion that a Sagnac interferometer has an inherently low background noise after the birefringence effect in the optical system is suppressed dramatically. Though a hysteresis loop for the polar Kerr effect from the 42-nm Ni film is not presented due to the range of the present electromagnet (~1000 Oe), one can see from the similarity between Equation (3b) and Equation (5) that the OI ZA-SI can also be used to detect the polar Kerr effect with comparable sensitivity as illustrated in FIG. 2.

Consequently, the present disclosed zero loop-area Sagnac interferometer at oblique incidence shares the general advantage of zero loop-area Sagnac interferometers by using the two orthogonal polarizing components of an optical beam as "the two counter-propagating beams" instead of using two separate beams. This spares the extra optics and complication associated with the beam splitting and recombination that only add to sources of drifts and noise in a Sagnac interferometer. In fact, the optical arrangement as shown in FIG. 1 is insensitive to the minute movement of the sample, unlike a finite loop-area Sagnac interferometer at oblique incidence. The noise performance of our present interferometer is measured. It is found that the noise has two components: one (±2 µrad/√Hz) is random and comes from the amplifier noise in the photo-receiver (Only 4 µW at the photo-receiver); the other (±7 µrad) drifts slowly and is due to the residual difference of the reciprocal phases acquired by two "counter-propagating" beams. The photon shot noise is estimated to be ±0.2 µrad/√Hz for $P_{ave}$=4 µW at the receiver, one order of magnitude less than the amplifier noise. The drift can be further reduced by more rigidly construction and better beam control after the 10-m PM fiber. The effect of the receiver noise can be lessened by using photo-receivers with significantly lower noise equivalent power (NEP) and/or increasing the power at the receiver (see another implementations). The minimum detectable Kerr angle of our present oblique-incidence Sagnac interferometer (~10 µrad/√Hz) is comparable to those of commercially available MOKE ellipsometers (e.g., HO-MOKE LB215 from Holmarc) and of the in-situ SMOKE instrument.

In summary, a zero loop-area Sagnac interferometer of the present disclosure is demonstrated in which the optical beam interacts with a sample at oblique incidence such that Kerr effects from in-plane magnetization in the sample can be measured. The oblique-incidence geometry affords multiple configurations for measuring the longitudinal Kerr effect so that one can choose the one configuration that maximizes the signal-to-noise ratio. Compared to finite loop-area Sagnac interferometers at oblique incidence, the zero loop-area Sagnac interferometer at oblique incidence avoids separating and recombining optical beams and thus has much fewer optical elements. It is thus inherently more stable and promises higher sensitivity to time-reversal breaking effects in a sample, just as normal incidence Sagnac interferometers.

Figure note: FIG. 1 is an arrangement of a zero loop-area Sagnac interferometer for measuring longitudinal and polar Kerr effect of a magnetized sample (a 42-nm Ni film on a silicon wafer in this case). The SA at the input of the 1-m PM fiber 107 is aligned to TA of the linear polarizer 105. The SA at the output of the 1-m PM fiber 107 bisects TM and TE axes of the electro-optic phase modulator (EOM) 109. The SA at the input of the 10-m PM fiber 111 is aligned to the TM axis of EOM 109. The SA at the output of the 10-m PM fiber 111 is aligned parallel to the p-polarization with respect to the sample 113. A portion of the returned beam is directed to a RF photo-receiver 121 and the photocurrent is analyzed with a phase-sensitive detector 131 (SRS844 Lock-in amplifier). The axes of magnetization are shown.

FIG. 2 is a block diagram illustrating a longitudinal Kerr rotation angle from a 42-nm Ni film vs. externally applied magnetic field, measured using the zero loop-area Sagnac interferometer at oblique incidence as shown in FIG. 1. The magnetic field is applied along the y-axis in the surface and parallel to plane of incidence. The data are acquired with a lock-in amplifier time constant set to $\tau=1$ sec.

FIG. 3 is a modified arrangement of a zero loop-area Sagnac interferometer 3000 for measuring the transvers of a magnetized sample (a 42-nm Ni film on a silicon wafer in this case) in accordance with some implementations of the present disclosure. The SA at the input of the 1-m PM fiber 207 is aligned to TA of the linear polarizer 205. The SA at the output of the 1-m PM fiber 207 bisects TM and TE axes of the electro-optic phase modulator (EOM) 209. The SA at the input of the 10-m PM fiber 211 is aligned to the TM axis of EOM 209. The SA at the output of the 10-m PM fiber 211 is aligned parallel to the p-polarization with respect to the sample 213. A portion of the returned beam is directed to a RF photo-receiver 221 and the photocurrent is analyzed with a phase-sensitive detector 231 (SRS844 Lock-in amplifier). The axes of magnetization are shown.

As shown in FIG. 3, the optical arrangement to measure the transverse Kerr rotation due to an x-component of the magnetization in the sample 213. In this geometry, $\Theta_{K,T}$ is related to $M_x$ through $\Theta_{K,T}=1\ m\{(2a/r_{pp})*M_x\}$ with parameter a being defined by references. $\alpha$ in Equation (1) of the main text is proportional to $|r_{pp}r_{ss}|^2$.

Figure 4:
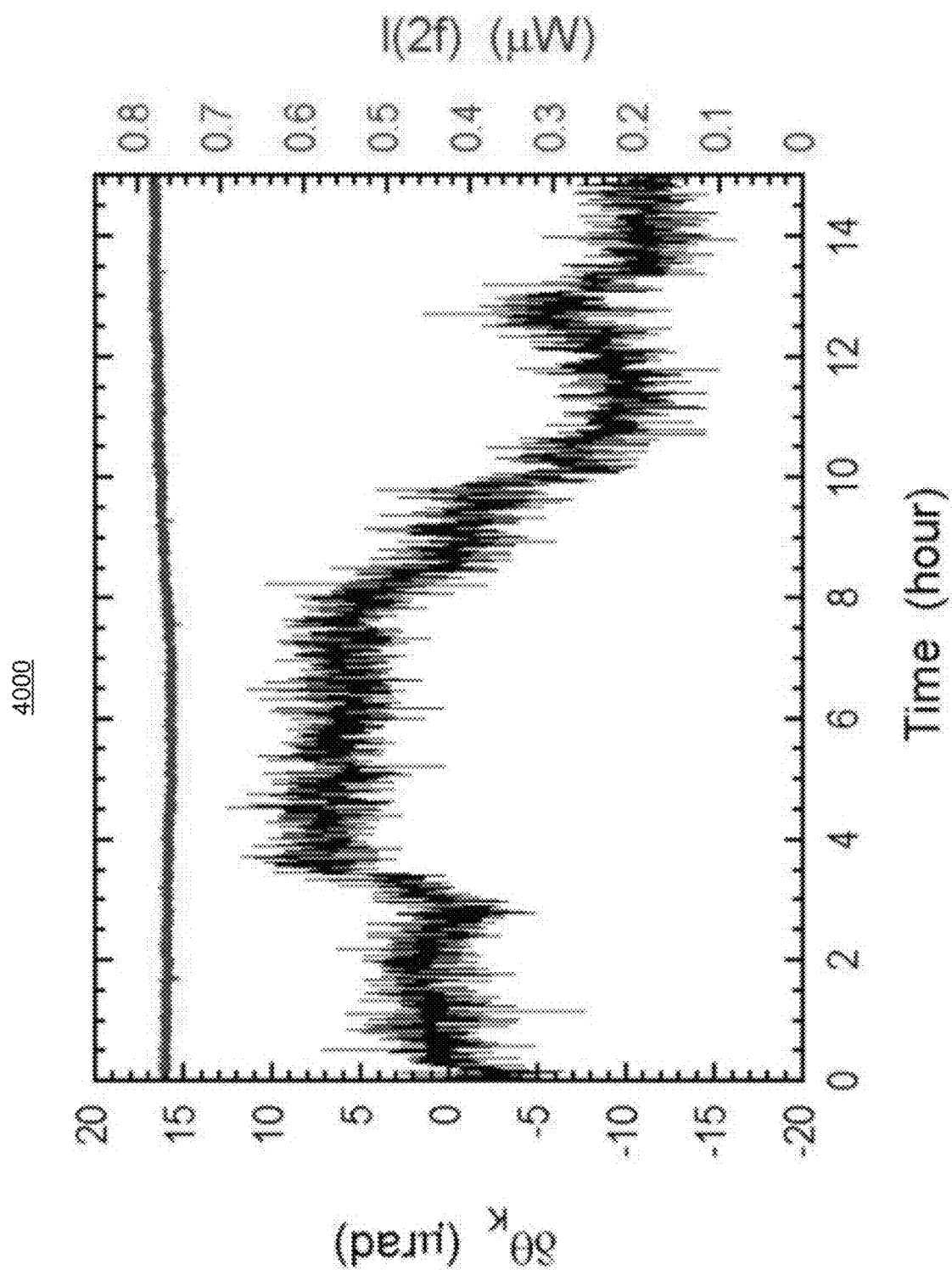
FIG. 4 is a block diagram illustrating an optical power measured at the photo-receiver through the second harmonic amplitude (upper solid line) and the variation in the transverse Kerr rotation angle (lower staggered line) over 15 hours.

FIG. 4 shows measurement results 4000 of the stability of the Sagnac interferometer as arranged in FIG. 1 by replacing the $N_i$ sample with an aluminum mirror only and then measuring the first harmonic without an applied magnetic field over 15 hours. It is first noted that the second harmonic $I(2f)=\alpha I_{inc}J_2(2\phi_0)$ changes less than 2.5% over 15 hours.

The variation in the second harmonic includes the change in the output power of the light source and in efficiencies of coupling the input power into the 1-m fiber and coupling the reflected beam back into the 10-m fiber. The bushy background in Kerr rotation measurement comes from the 125-MHz photo-receiver with a noise equivalent power ~3.3 pW/√Hz. This amplifier noise amounts to a noise of ±2 µrad/√Hz in Kerr rotation measurement. This noise can be improved by increasing the overall optical power at the photo-receiver and/or using a photo-receiver with a significantly lower noise-equivalent power (NEP) than 3.3 pW/√Hz. On top of the amplifier noise the first harmonic signal drifts such that it causes a slow drift of ±7 µrad in Kerr rotation measurement. It is not due to the change in the optical power at the photo-receiver because (1) the drift in the first harmonic amplitude does not follow the change in the second harmonic amplitude; (2) the latter varies by only 2.5% over 15 hours. As a result, for the most part it comes from the residual difference in the reciprocal phases acquired by the two "counter-propagating" beams as the forward and backward paths and the spatial profiles of the beam between exiting and reentering the 10-m PM fiber cannot be made perfectly identical. In the arrangement in FIG. 1, it is found that even when the returned beam is coupled back into the 10-m PM fiber within 1.5% of the maximum (the limit of mechanical adjustment in the present optical setup), the residual phase difference can still be as large as 5~10 µrad/√Hz. In the presence of such a residual reciprocal phase difference δθ, Equation (1) in the main text should be modified to the following, $$I(t)=\alpha I_{inc}[\beta+J_1(2\Phi_0)\sin(2\pi ft)\sin(\delta\theta+2\theta_K)-J_2(2\Phi_0)\cos(4\pi ft)\cos(\delta\theta+2\theta_K)+\ldots] \quad (S1)$$

δθ can be reduced with a combination of a better mechanical control of the reflection mirror and a more rigid and thermally stable construction of the interferometer so that an oblique-incidence zero loop-area Sagnac interferometer performs at least with the same sensitivity as the normal incidence zero loop-area interferometer.

FIG. 4 shows an optical power measured at the photo-receiver through the second harmonic amplitude (upper solid line) and the variation in Kerr rotation angle (lower staggered line) over 15 hours. The total power at the detector is 3.2 µW, 4 times I(2f). The power drifts less than 2.5% over the time period. The fluctuation and drift in Kerr rotation angle result from the amplifier noise of ±2 rad/√Hz (with the Lock-in time constant set to 1 sec) and the residual difference (±7 µrad) of the reciprocal phases between the two counter-propagating beams in our present interferometer.

FIG. 5 is a block diagram illustrating transverse Kerr rotation angle from a 42-nm Ni film vs. externally applied magnetic field, measured using a modified zero loop-area Sagnac interferometer at oblique incidence (see the arrangement in FIG. 3). The magnetic field is applied along the x-axis in the surface plane, namely, the axis that is perpendicular to the plane of incidence.

Figure 6:
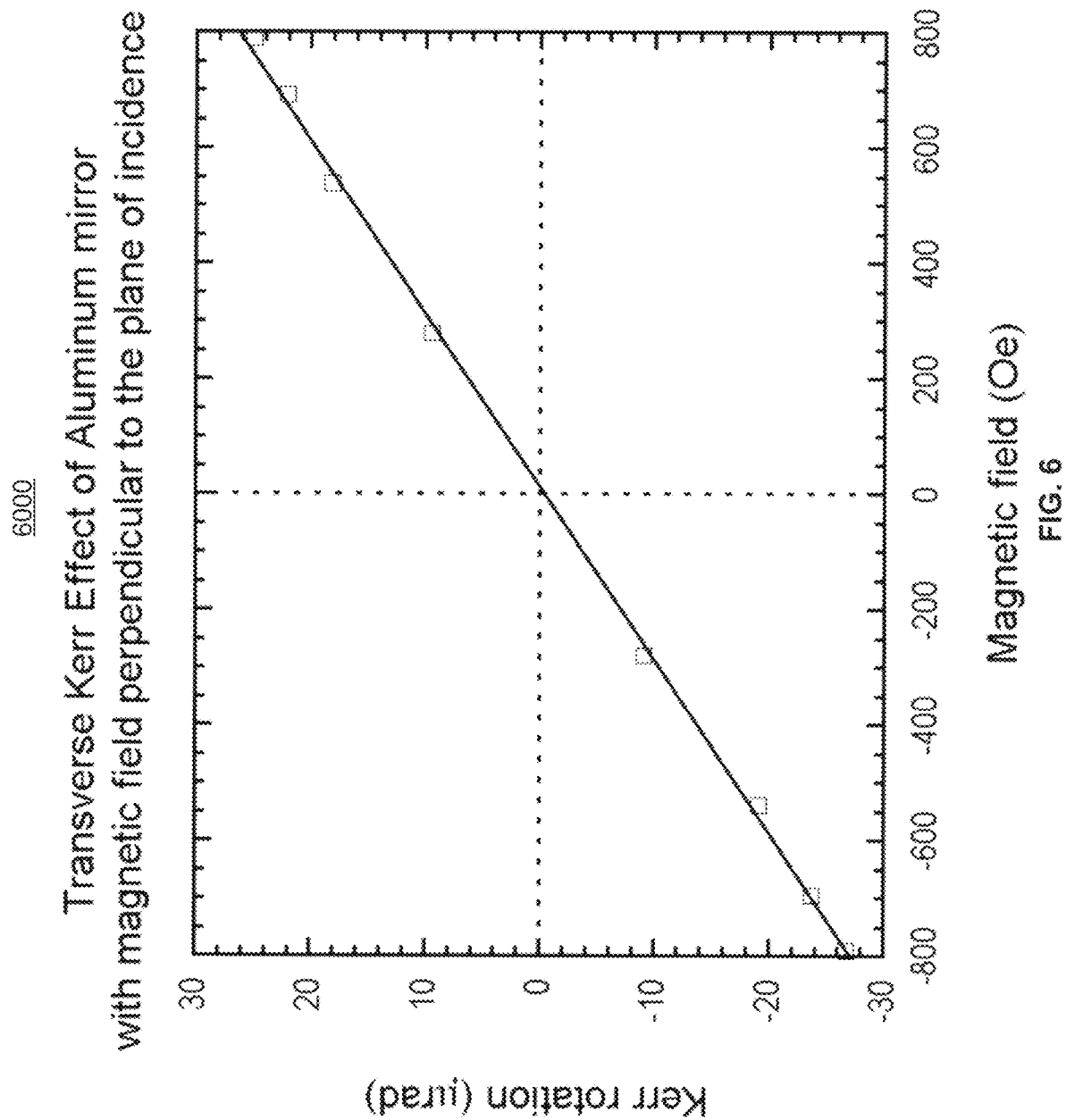
FIG. 6 is a block diagram illustrating the transverse Kerr rotation angle of aluminum mirror with magnetic field perpendicular to the plane of incidence measured using a modified zero loop-area Sagnac interferometer at oblique incidence as shown in FIG. 3.

FIG. 6 is block diagram illustrating transverse Kerr effect of aluminum mirror with magnetic field perpendicular to the plane of incidence measured using a modified zero loop-area Sagnac interferometer at oblique incidence (see the arrangement shown in FIG. 3).

Symmetry Considerations and Optical Arrangements

Beside the implementations of the previous disclosure, there are also other arrangements that enables measurement of magneto-optic effects due to both in-plane and out-of-plane magnetization of the sample with optimizable signal-to-noise ratios.

As explained in the present disclosure, intrinsic magnetic ordering and responses to externally applied fields (electric as well as magnetic) are among the most important characteristics of materials, whether in gas phase, liquid phase, or solid phase. One important class of experimental methods for studying such magnetic properties of a material is based on the optical response to the magnetization in the material. The latter alters the polarization state of a reflected (Kerr effect) and transmitted (Faraday effect) optical beam through dielectric tensor elements induced by the magnetization. Though not as sensitive as SQUID-based methods that directly measure the magnetization in a sample, optical methods have the advantage of being non-intrusive, versatile, and applicable over a wide range of experimental conditions, and being a local probe to the magnetic property only from the illuminated region of the sample.

In practice, linear birefringence is ubiquitous, particularly in elements of an optical detection system. In this study, the birefringence is referred as linear dielectric responses of uniaxial materials, biaxial materials, and optically active and dichroic materials that preserve time reversal symmetry. The present disclosure separately considers linear magneto-optic responses of materials that break time-reversal symmetry, even though the magnetooptical responses also cause birefringence. Because the optical response to birefringence is orders of magnitude larger than the magneto-optic response, even residual birefringence readily produces an overwhelming effect on the polarization state of an optical beam. As a result, magneto-optic measurements are typically done by modulating the magnetization and detecting corresponding changes in the polarization state of the optical beam with phase-sensitive or equivalent methods. Modulation-based detection has enabled measurements of Kerr rotation (in reflection geometry) and Faraday rotation (in transmission geometry) as small as $10^{-7}$ rad. When repeatedly altering the sample magnetization for measurement is not an option, the effect of birefringence can still be removed if one takes advantage that the magneto-optic effect breaks time-reversal symmetry (TRS) while the birefringence maintains TRS.

A Sagnac interferometry is an optical detection system that measures the time-reversal-symmetry-breaking (TRSB) effect while suppressing effects that observe TRS. In such an interferometer, an optical beam and its time-reversal counterpart traverse an identical loop-wise path but in the opposite direction. One measures the difference of the phases acquired by these two beams. The birefringence in the loop produces a reciprocal (direction-independent) phase that is common to both beams. As a result, the birefringence effect is removed in the differential phase by symmetry. If the optical path includes reflection from and/or transmission through a magnetized sample, the magneto-optic effect yields a non-reciprocal (direction-dependent) phase in the two beams that have the same amplitude but opposite signs. Consequently, the magneto-optic effect that breaks TRS is doubled in the differential phase instead. The Sagnac interferometer measures this differential phase.

If the loop-wise path in a Sagnac interferometer (i.e., the Sagnac loop) encloses a finite area, time-reversal symmetry breaking effects can have a contribution from the Doppler's effect when the loop as a whole also executes a rotational motion or a combination of rotational motions. If the loop-wise optical path encloses no area (also known as "loop-less" or zero loop-area), time-reversal symmetry breaking effects only come from materials that the beams traverse through or reflect off. For a finite loop-area Sagnac interferometer, optical beams are produced through beam-splitting optical elements and can be configured to be either normally or obliquely incident on a sample so that effects of magnetization parallel as well as perpendicular to the sample surface can be measured. Because the two counter-propagating beams are controlled separately and need to be recombined eventually before detection, extra optical elements are needed. These elements are introduced in ways that are difficult to maintain the two counter-propagating beams exactly along the same Sagnac loop, making a finite loop-area interferometer more readily subject to residual mis-alignments and mechanical drifts in the interferometer including the sample. This has so far limited its sensitivity for Kerr rotation measurement to $1\times10^6$ rad. For a zero loop-area Sagnac interferometer, two counter-propagating beams are two orthogonally polarized components of the single optical beam, and thus one does not need beam splitting and beam recombination for operation. As a result, significantly fewer optics are needed, and the interferometer can be arranged to minimize effects of mis-alignment and mechanical drifts. Such a zero-area Sagnac interferometer can detect Kerr rotation as small as $10^{-7}$ rad without modulating magnetization.

The oblique-incidence zero loop-area Sagnac interferometer (OI ZA-SI) in accordance with some implementations of the present disclosure in which the optical beams interact with a magnetized sample at oblique incidence so that effects of in-plane magnetization, namely, longitudinal and transverse Kerr effects, can be measured as mentioned above. In the present section, more symmetry considerations in such an interferometer will be presented. Some of the symmetry properties are common to all forms of Sagnac interferometers, while others are available only to the interferometers at oblique-incidence as in the present disclosure. Through symmetry consideration, the arrangement of the oblique-incidence zero loop-area Sagnac interferometer of the present disclosure may be individually optimized to detect components of magnetization in a sample.

Oblique-Incidence Zero Loop-Area Sagnac Interferometer (OI ZA-SI)

Figure 7:
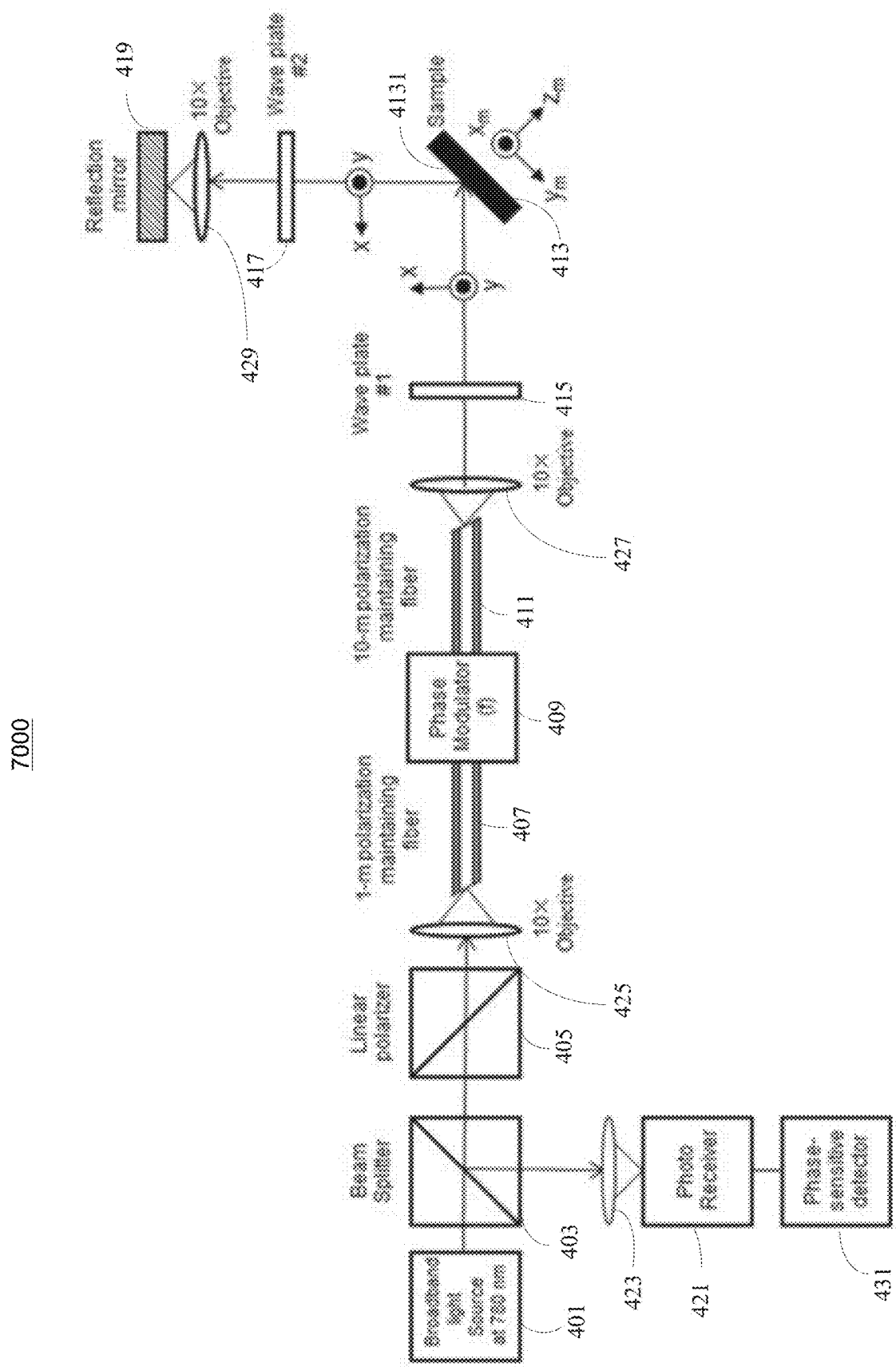
FIG. 7 is a block diagram illustrating an arrangement of a zero loop-area Sagnac interferometer in accordance with some implementations of the present disclosure for measuring longitudinal and polar Kerr effects of a magnetized sample.

An arrangement of such an interferometer is shown in the block diagram 9000 in FIG. 7. A broad-band source 401 is collimated and passes through a beam splitter 403 and a linear polarizer (PL) 405 with the transmission axis (TA) aligned parallel to the slow axis (SA) of a 1-m polarization-maintaining (PM) fiber 407. The SA of the fiber 407 bisects the transverse magnetic TM axis and the transverse electric (TE) axis of an electro-optic modulator (EOM) 409 that adds a time-dependent phase to the TM mode. The beam after EOM 409 is coupled into a 10-m PM fiber 411 with the TM axis aligned to the SA axis of the fiber 411. The SA of the 10-m PM fiber 411 at the output end is aligned parallel to the p-polarization with respect to the sample 413. The optical beam emerging from the 10-m fiber 411 diverges and is thus collimated with a 10× objective 427 and passes through a wave plate (Wave plate #1) 415. Up to this point, the arrangement is in essence same as a normal incidence zero loop-area Sagnac interferometer (NI ZASI). It is to prepare two orthogonally polarized components from a single optical beam with the short coherent length (in the order of 20-30 μm), add a time-dependent phase $\Phi(t)=\Phi_0 \cos(2\pi ft) = \Phi_0 \cos(\Omega t)$ to each of them but at a delayed time τ, recombine the two components when they return, and send the recombined beam to a photo-receiver 421 (by the beam splitter 403) for the Fourier analysis to yield the differential phase. The differential phase reveals the time-reversal symmetry breaking effect in the optical path beyond this portion of the interferometer. The second portion of the interferometer differs from a normal-incidence interferometer, most notably the oblique incidence at the sample 413 and a reflection mirror 419 that sends the beam back to complete the Sagnac loop without enclosing a loop area. These differences enable such a zero loop-area Sagnac interferometer to detect in-plane as well as out-of-plane components of the magnetization in a magnetized sample 413. From symmetry considerations as the present disclosure outlines next, an OI ZA-SI enables different arrangements such that one can choose one that yields the magneto-optic response from a Cartesian component of the sample magnetization with the highest available signal-to-noise ratio.

Figure 9:
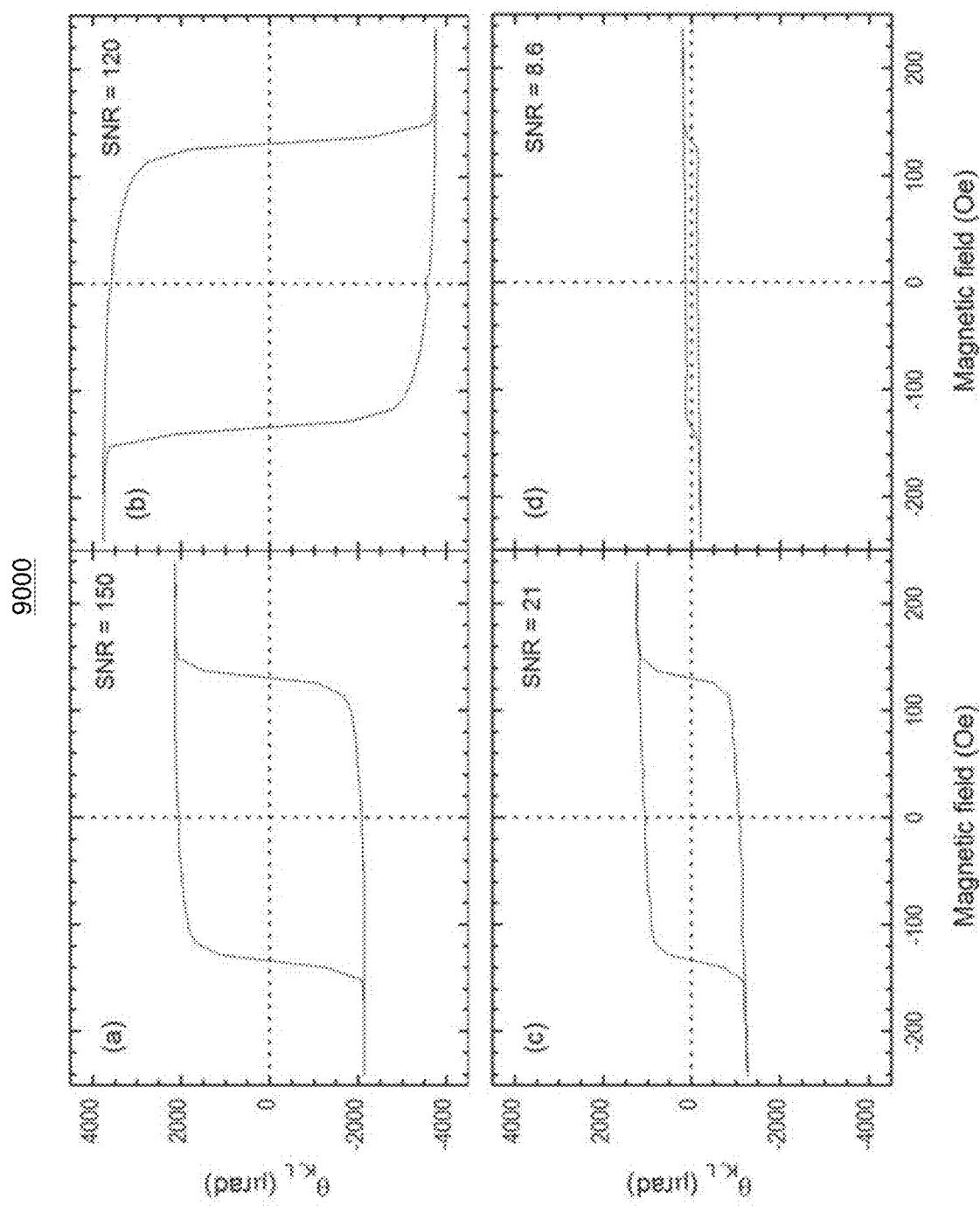
FIG. 9 is a block diagram illustrating the longitudinal Kerr rotation $\theta_{K,L}=\alpha_K/2$ measured from the 32-nm Co film in the form of hysteresis loop using all four optical arrangements as shown in FIGS. 8A-8D.

FIG. 9 is an arrangement of a zero loop-area Sagnac interferometer for measuring longitudinal and polar Kerr effects of a magnetized sample. The TA of the linear polarizer 405 is aligned to the SA of the 1-m PM fiber 407. The latter (1-m PM fiber 407) bisects TM and TE axes of the electro-optic phase modulator (EOM) 409. The SA of the 10-m PM fiber 411 is aligned to the TM axis of EOM 409 and parallel to the x-axis before the sample 413. Wave plate #1 415 is set to produce $$P_1 = \begin{bmatrix} a \\ be^{i\varphi} \end{bmatrix} \text{ and } P_2 = \begin{bmatrix} b \\ -ae^{i\varphi} \end{bmatrix}$$

(with $\sqrt{a^2+b^2}=1$.) from $$P_{10} = \begin{bmatrix} 1 \\ 0 \end{bmatrix} \text{ and } P_{20} = \begin{bmatrix} 0 \\ 1 \end{bmatrix}.$$

A portion of the returned beam is directed to a photo-receiver 421 with the beam splitter 403, and the photocurrent is analyzed with a phase-sensitive detector 431.

Before going into symmetry considerations, one should revisit the Jones vectors for orthogonally polarized components for an optical beam and Jones matrices for optical elements including a magnetized sample in an interferometer. Symmetry considerations will be discussed on the basis of these Jones matrices and Jones vectors. Let $$P_{10} = \begin{bmatrix} 1 \\ 0 \end{bmatrix} \text{ and } P_{20} = \begin{bmatrix} 0 \\ 1 \end{bmatrix},$$

be two linearly polarized components of the broadband optical beam emerging from the 10-m PM fiber 411: one is aligned along the SA of the PM fiber (i.e., the p-polarization with respect to the sample), and the other is aligned along the fast axis (FA) of the fiber (i.e., the s-polarization with respect to the sample). Two orthogonally polarized components are produced $$P_1 = \begin{bmatrix} a \\ be^{i\varphi} \end{bmatrix}, \text{ and } P_2 = \begin{bmatrix} b \\ -ae^{i\varphi} \end{bmatrix}$$

(with $\sqrt{a^2+b^2}=1$) before they are obliquely incident on the sample from $$P_{10} = \begin{bmatrix} 1 \\ 0 \end{bmatrix} \text{ and } P_{20} = \begin{bmatrix} 0 \\ 1 \end{bmatrix}$$

using a suitable wave-plate. $P_1$ and $P_2$ are the initial states of the two "counter-propagating beams." Let $$M = \begin{bmatrix} m_{11} & m_{12} \\ m_{21} & m_{22} \end{bmatrix} \quad (1)$$

be the Jones matrix that represents the effect of all optical elements encountered by the "beams" as they traverse to the sample 413 and eventually return after the second reflection from the sample 413. The matric elements include terms that vary linearly with three Cartesian components of the sample magnetization. The differential phase detected by the interferometer is given by $$\alpha_K = 2\theta_K = \text{Arg}\left\{\frac{P_2^\dagger M P_1}{P_1^\dagger M P_2}\right\} = \text{Arg}\left\{\frac{[ab(m_{11} - m_{22}e^{i2\varphi}) + (b^2-a^2)(m_{21}+m_{12})e^{i\varphi}/2] - (m_{21}-m_{12})e^{i\varphi}/2}{[ab(m_{11} - m_{22}e^{i2\varphi}) + (b^2-a^2)(m_{21}+m_{12})e^{i\varphi}/2] + (m_{21}-m_{12})e^{i\varphi}/2}\right\} \quad (2)$$

where $\theta_K$ is customarily defined as the Kerr rotation. If the time reversal symmetry holds for all optical elements including the sample, then $m_{12}=m_{21}$ from a general consideration (as this will be elaborated in Sec. III) and $\alpha_K=0$. If the time reversal symmetry is broken, the present disclosure expects $m_{12}\neq m_{21}$ and the Kerr rotation $\alpha_K\neq 0$. To measure $\alpha_K$, it is easily shown that the first two harmonics of the EOM modulation frequency $\Omega$ obtained from the Fourier analysis of the photocurrent produced in the receiver are $$I(\Omega)\cong(\gamma/2)I_{inc}|P_2^\dagger M P_1|^2 J_1(2\Phi_0)\alpha_K = (\gamma/2)I_{inc}|ab(m_{11}-m_{22}e^{i2\varphi})+(b^2-a^2)(m_{21}+m_{12})e^{i\varphi}/2|^2 J_1(2\Phi_0)\alpha_K, \quad (3a)$$

$$I(2\Omega)\cong(\gamma/2)I_{inc}|P_2^\dagger M P_1|^2 J_2(2\Phi_0) = (\gamma/2)I_{inc}|ab(m_{11}-m_{22}e^{i2\varphi})+(b^2-a^2)(m_{21}+m_{12})e^{i\varphi}/2|^2 J_2(2\Phi_0), \quad (3a)$$

where $\Omega$ (rad/s) is the angular frequency of the time-dependent phase $\Phi(t)$. It is set such that $\Omega\tau=\pi$ and thus extra timedependent phases added to the two "counter-propagating beams" are $\Phi(t)=\pm\Phi_0\cos(\Omega t)$,—equal in magnitude and yet opposite in sign. $I_{inc}$ is the power of the light source 401 right before entering the beam splitter 403. $\gamma$ is the overall throughput factor due to passing through the beam splitter 403, the linear polarizer 405, collimation and focusing lenses (objectives) 425, the PM fiber-EOM-PM fiber assembly 407, 409, and 411, and reflection off the sample twice. J1(x) and J2(x) are the Bessel functions. From measured values of $I(\Omega)$ and $I(2\Omega)$, one can deduce the differential phase $$\alpha_K = \frac{I(\Omega)}{I(2\Omega)}\frac{J_2(2\Phi_0)}{J_1(2\Phi_0)}, \quad (4)$$

where $\alpha_K$ is a linear function of the Cartesian components of the sample magnetization and contributions to $\alpha_K$ from these components depend upon choices of $$P_1 = \begin{bmatrix} a \\ be^{i\varphi} \end{bmatrix} \text{ and } P_2 = \begin{bmatrix} b \\ -ae^{i\varphi} \end{bmatrix},$$

reflectivity coefficients of the sample, and optical elements after the sample through the Jones matrix in Eq. (1). The polar Kerr effect refers to the contribution from the $z_m$ component of the magnetization (see FIG. 9); the longitudinal Kerr effect refers to the contribution from the $y_m$ component of the magnetization, and transverse Kerr effect refers to the contribution from the $x_m$ component of the magnetization. Since components of the sample magnetization transform differently under crystal symmetry operations, one should be able to choose $P_1$ and $P_2$ and optical elements after the sample so that the magneto-optic effect associated with a particular component is predominant.

In Sec. III, the symmetry considerations in deciding on $$P_1 = \begin{bmatrix} a \\ be^{i\varphi} \end{bmatrix} \text{ and } P_2 = \begin{bmatrix} b \\ -ae^{i\varphi} \end{bmatrix}$$

and optical elements after the sample will be discussed. These considerations enable finding arrangements in an OI ZA-SI that detect the magneto-optic effect from each of the three Cartesian components of the sample magnetization with the highest available signal-to-noise ratios. Specifically, the symmetry-based choices will be explored that maximize the product of $[ab(m_{11}-m_{22}e^{i2\varphi})+[(b^2-a^2)(m_{21}+m_{12})e^{i\varphi}]/2]^2$ and $\alpha_K$ in Eqs. (3a) and (3b).

Constraints of Symmetry Operation on Magneto-Optical Responses in an OI ZA-SI

A. Time Reversal Symmetry (TRS) on Jones Matrices of Optical Elements

The properties of Jones matrices of optical elements including the sample in an OI ZA-SI system are first examined. Since the time reversal symmetry may be broken, for each optical element, the Jones matrix for the forward-traveling beam from the matrix for the backward-traveling beam needed to be distinguished. The convention used by Kapitulnik et al. was adopted for the x-y frame in which the Jones vector for the polarization state of a light beam (optical beam) is defined, and the convention used by Dodge et al. for the $x_m$-$y_m$-$z_m$ frame in which the components of the magnetization in a sample 413 are expressed as shown in FIG. 9. Generally for any optical element in the interferometer including the sample, Jones matrices for a forward-propagating beam and a backward-propagating beam can be written down as $$M^{(f)} = \begin{bmatrix} f_{11} & f_{12} \\ f_{21} & f_{22} \end{bmatrix}, \quad (5)$$

$$M^{(b)} = \begin{bmatrix} b_{11} & b_{12} \\ b_{21} & b_{22} \end{bmatrix}. \quad (6)$$

If the optical element preserves the time-reversal symmetry (TRS), it is easy to see that TRS requires $$f_{11}=b_{11}, \quad (7a)$$

$$f_{22}=b_{22}, \quad (7b)$$

$$f_{12}=b_{21}, \quad (7c)$$

$$f_{21}=b_{12}, \quad (7d)$$

For a sequence of optical elements that preserve TRS, it is as easy to show that Eqs. (7) hold for the forward-propagating and the backward-propagating beams through these elements as a whole. Since for a zero loop-area Sagnac interferometer, Jones matrices for the forward-propagating beam and the backward-propagating beam are the same and are given by Eq. (1), TRS requires $m_{12}=m_{21}$ in Eq. (1). From Eq. (2), the differential phase $\alpha_K$ vanishes in this case. If an optical element such as a magnetized sample breaks TRS, Eqs. (7a)-(7d) no longer hold in general. Such an element gives rise to a Faraday effect (if a transmitting optical element breaks TRS) or a Kerr effect (if a reflecting optical element breaks TRS). For example, the reflection matrix of a magnetized sample for a forward-propagating beam is $$M_R^{(f)} = \begin{bmatrix} r_p + \alpha_x m_x & \alpha_y m_y + \alpha_z m_z \\ -\alpha_y m_y + \alpha_z m_z & r_s \end{bmatrix}. \quad (8)$$

For a backward-propagating beam, the reflection matrix of the sample is $$M_R^{(b)} = \begin{bmatrix} r_p - \alpha_x m_x & \alpha_y m_y - \alpha_z m_z \\ -\alpha_y m_y - \alpha_z m_z & r_s \end{bmatrix}. \quad (9)$$

When at least one of the three Cartesian components ($m_x$, $m_y$, $m_z$) of the sample magnetization is non-zero, $m_{12} \neq m_{21}$ is expected for the Jones matrix in Eq. (1) and a non-zero differential phase $\alpha_K$ emerges.

Imperfections in optical elements and alignments may exist. The imperfections, however, may be represented by a combination of "unaccounted" elements such as waveplates, rotators, and linear polarizers. As long as these elements preserve TRS, their effects only change relative contributions by components of the sample magnetization to $\alpha_K$ and vanish if the sample is not magnetized.

B. Crystal Symmetries on Magneto-Optic Responses in Different Optical Arrangements Now consider the effect of crystal symmetries on the magnet-optic response and how it enables one to measure the Kerr rotation due to each Cartesian component of the sample magnetization with the optimal signal-to-noise ratio. Similar to the account offered by Dodge et al. on the crystal symmetry effect on magneto-optic responses in a finite-area Sagnac interferometer, it is concerned that the orthogonally polarized beams $P_1 = [_{be^{i\varphi}}^a]$ and $P_1 = [_{-ac^{i\varphi}}^b]$ that transform into one another under the operation of a crystal symmetry such as $C_2$ and $\sigma_v$, or a combination of the two that maps the source plane of the forward-traveling beam to the source plane of the backward-traveling beam after either one reflection or two reflections from the sample. If a component of the magnetization changes under the operation, such a component will contribute to $\alpha_K$, otherwise $\alpha_K$ contains no contribution for the component. If there are more than one pair of orthogonally polarized beams (i.e., different choices of a, b, and $\phi$) that transform into one another under the same symmetry operation or for the same polarization pair, there are more than one optical arrangement after the sample that keep the symmetry operation, the contribution from a sample magnetization component to $\alpha_K$ is expected to be different from one pair to another or from one arrangement to another. This affords the option to detect the Kerr effect from such a magnetization component with the highest available signal-to-noise ratio.

For a normal-incidence ZA-SI, the symmetry that maps the source of the forward-traveling beam onto the source of the backward-traveling beam and at the same time changes the zm component of the sample magnetization (a pseudo-vector) is the reflection through the $y_m$-$z_m$ plane ($\sigma_v'$) followed by the reflection through the $x_m$-$z_m$ plane ($\sigma_v$)—the mm operation. The only choice of the orthogonally polarized beams is $$P_1 = \frac{1}{\sqrt{2}} \begin{bmatrix} 1 \\ e^{i\varphi} \end{bmatrix} \text{ and } P_2 = \frac{1}{\sqrt{2}} \begin{bmatrix} 1 \\ -1e^{i\varphi} \end{bmatrix}$$

with P1=mmP2 and P2=mmP1. In this case, the Jones matrix M is simply the reflection matrix for the forward-traveling beam with $m_{11}=m_{22}=r_p=r_s=r_n$ and $m_{12}=-m_{21}=\alpha_z m_z$. As a result, one only measures the polar Kerr rotation given by $$\alpha_K \cong \frac{1}{\sin\varphi} \times \text{Re}\left\{\left(-\frac{2\alpha_z m_z}{r_n}\right)\right\}, \quad (10)$$

$$I(\Omega) \sim |r_n|^2 \sin\varphi \times \text{Re}\left\{\left(-\frac{2\alpha_z m_z}{r_n}\right)\right\}. \quad (11)$$

The parameter choice of P1 and P2 that maximizes I($\Omega$) or the signal-to-noise ratio is $\phi=\pi/2$.

It should be noted that crystal symmetries apply to finite-area Sagnac interferometers when two counter-propagating beams reflect off a magnetized sample only once and the Jones matrices for forward-traveling and backward-traveling beams are simply the corresponding reflection matrices given by Eqs. (8) and (9). For an oblique-incidence zero loop-area Sagnac interferometer, the Jones matrix in Eq. (1) includes effects of reflection twice off the sample from the opposite directions and effects of extra optical elements after the sample. And it is the same for both the forward-traveling and backward traveling beams. As a result, crystal symmetry operations that map the source of the forward-traveling beam to the source of the backwardtraveling beam are $\sigma_v C_2 = C_2 \sigma_v$ and $\sigma_v'$. Under the operation of either one of them, $m_y$ and $m_z$ change signs while $m_x$ remains unchanged.

Pairs of orthogonally polarized states that transform into one another under the operation of $\sigma_v C_2 = C_2 \sigma_v$ or $\sigma_v'$ are $$P_1 = \frac{1}{\sqrt{2}} \begin{bmatrix} 1 \\ e^{i\varphi} \end{bmatrix} \text{ and } P_2 = \frac{1}{\sqrt{2}} \begin{bmatrix} 1 \\ -1e^{i\varphi} \end{bmatrix},$$

namely, $P1 = \sigma_v C_2 P_2 = \sigma_v' P_2$. If the optical elements after the sample remain unchanged under the same operation, the effect of the symmetry operation on the components of the magnetization is the only thing to be considered. This means that the Kerr rotation $\theta_K$ or the differential phase $\alpha_K$ only has contributions from $m_y$ and $m_z$ (longitudinal Kerr and polar Kerr effect), $$\alpha_K = \text{Arg} \left\{ \frac{(m_{11} - m_{22} e^{i2\varphi}) - (m_{21} - m_{12}) e^{i\varphi}}{(m_{11} - m_{22} e^{i2\varphi}) + (m_{21} - m_{12}) e^{i\varphi}} \right\}, \quad (12)$$

$$I(\Omega) \sim \frac{1}{4} |(m_{11} - m_{22} e^{i2\varphi})|^2 \times \text{Arg} \left\{ \frac{(m_{11} - m_{22} e^{i2\varphi}) - (m_{21} - m_{12}) e^{i\varphi}}{(m_{11} - m_{22} e^{i2\varphi}) + (m_{21} - m_{12}) e^{i\varphi}} \right\}. \quad (13)$$

For example, if there is no extra optical element after the sample except for the reflection mirror at normal incidence, there is $$\begin{bmatrix} \alpha_y m_y (r_P + r_s) + \alpha_z m_z (r_P - r_s) \\ r_s^2 \end{bmatrix} \quad (14)$$

The differential phase only has contributions from longitudinal and polar Kerr effects, $$\alpha_K = \text{Im} \left\{ \frac{4(\alpha_y m_y (r_p + r_s) + \alpha_z m_z (r_p - r_s)) e^{i\varphi}}{(r_p^2 - r_s^2 e^{i2\varphi})} \right\}, \quad (15)$$

$$I(\Omega) \sim |(r_p^2 - r_s^2 e^{i2\varphi})| \times |(\alpha_y m_y (r_p + r_s) + \alpha_z m_z (r_p - r_s)) e^{i\varphi}|. \quad (16)$$

In this arrangement, one is best served to measure the Kerr effect for the magnetization component that has the larger of $|r_p + r_s|$ and $|r_p - r_s|$. The measurement is further optimized by choosing $\phi$ that maximizes $|(r_p^2 - r_s^2 e^{i2\Phi})|$. For example, for most opaque materials such as Ni, Co, and Fe, the reflectivity coefficients for p- and s-polarization have opposite signs and thus $|r_p - r_s| < |r_p + r_s|$. In this case, this geometry is best for measuring the polar Kerr effect. One can further choose $\Phi = \pi/2$ to maximize $|(r_p^2 - r_s^2 e^{i2\Phi})|$.

If a first quarter-wave plate 415 is added (Wave plate #2 in FIG. 7) with the fast axis along the y-axis, this element remains unchanged under the operation of $\sigma_v C_2 = C_2$ or $\sigma_v'$. In this case, $$M = \begin{bmatrix} r_p^2 & \alpha_y m_y (r_p - r_s) + \alpha_z m_z (r_p + r_s) \\ -\alpha_y m_y (r_p - r_s) - \alpha_z m_z (r_p + r_s) & -r_s^2 \end{bmatrix}, \quad (17)$$

$$\alpha_K = \text{Im} \left\{ \frac{4(\alpha_y m_y (r_p - r_s) + \alpha_z m_z (r_p + r_x)) e^{i\varphi}}{(r_p^2 + r_s^2 e^{i2\varphi})} \right\}, \quad (18)$$

$$I(\Omega) \sim |(r_p^2 + r_s^2 e^{i2\varphi})| \times |(\alpha_y m_y (r_p - r_s) + \alpha_z m_z (r_p + r_s)) e^{i\varphi}|, \quad (19)$$

In this arrangement, one is best served to measure the longitudinal Kerr effect for opaque materials as $|r_p - r_s| < |r_p + r_s|$. The measurement is further optimized by choosing $\phi = 0$ that maximizes $|(r_p^2 + r_s^2 e^{i2\Phi})|$. This is the arrangement used to measure the longitudinal Kerr effect from a 42-nm Ni film with an OI ZA-SI. It is easily seen that adding an arbitrary wave-plate with the fast axis along the yaxis works as well, and one may even choose $\phi$ other than 0 to further improve $r_p^2 + r_s^2 e^{i2\Phi}$, although the benefits are not significant.

To detect the transverse Kerr effect exclusively from the $x_m$-component of the magnetization (i.e., $m_x$), a quarter-wave plate is added (Wave plate #2 in FIG. 9) after the sample with its fast axis set at 45° from the x-axis. In this case, the optical arrangement is no longer invariant under the operation of $\sigma_v C_2 = C_2 \sigma_v$ or $\sigma_v'$ and the contribution from the transverse Kerr effect is expected. In this, the Jones matrix M becomes $$M = \begin{bmatrix} 0 & r_s (r_p + \alpha_x m_x) \\ r_s (r_p + \alpha_x m_x) & 0 \end{bmatrix}. \quad (20)$$

With a general form of two orthogonally polarized states $$P_1 = \begin{bmatrix} a \\ b e^{i\varphi} \end{bmatrix} \text{ and } P_2 = \begin{bmatrix} b \\ -a e^{i\varphi} \end{bmatrix},$$

there are $$\alpha_K = \frac{1}{(b^2 - a^2)} \text{Im} \left\{ \frac{2\alpha_x m_x}{r_p} \right\}, \quad (21)$$

$$I(\Omega) \sim |r_p - r_s|^2 (b^2 - a^2) \times \text{Im} \left\{ \frac{2\alpha_x m_x}{r_p} \right\}, \quad (22)$$

The optimal choice for measuring the transverse Kerr effect is either a=1 and b=0 or vice versa, namely, $$P_1 = \begin{bmatrix} 1 \\ 0 \end{bmatrix} \text{ and } P_2 = \begin{bmatrix} 0 \\ 1 \end{bmatrix}.$$

In fact, this is the equivalent of a zero loop-area Sagnac interferometer to the situation in a finite loop-area Sagnac interferometer where P1 and P2, for two counterpropagating beams coming from the opposite sides of the magnetized sample, are both p-polarized and by symmetry only the transverse Kerr effect contributes to the differential phase. In the present OI ZA-SI, the quarter-wave plate serves to turn the s-polarized backward-propagating beam into a p-polarized beam while the p-polarized forward-propagating beam into an s-polarized beam after the first reflection but before the second reflection off the sample. As a result, the two beams sense the reflection matrix [Eqs. (8) and (9)] but from the opposite directions as the p-polarized light. It is noted that imperfections in optical elements along the Sagnac loop such as wave plates, objectives, and the sample alters the Jones matrix M from what have been presented in this section. They tend to mix contributions from the three magnetization components at ratios somewhat different from what was described, depending upon the extent of imperfection.

Experimental Data

A. Detection of Longitudinal and Transverse Kerr Effects Due to in-Plane Magnetization in a 32-Nm Co Film To examine the findings of Sec. II, the Kerr effect was measured from a 32-nm Co film in the presence of an applied magnetic field using different optical arrangements of the OI ZA-SI as discussed in Sec. III B. The Co film has an easy axis of magnetization in the plane of the film. An electromagnet is used to produce a variable magnetic field up to 1850 Oe. The latter is not strong enough to magnetize the Co film along the $z_m$-axis (perpendicular to the film surface). As a result, a magnetic field is only applied along the $y_m$-axis or the $x_m$-axis and observe the longitudinal Kerr effect due to my and the transverse Kerr effect due to $m_x$.

As shown in FIG. 9, a linearly polarized, collimated broadband light source centered at 780 nm with a full bandwidth of 30 nm and an initial power of 1 mW was used (QPhotonics, Ann Arbor, Mich.). The electro-optic modulator (EOM) 409 is a $LiNbO_3$ phase modulator with $V\pi=1.3$ V (EOSPACE Inc., Redmond, Wash.). A sinusoidal wave form to the EOM 409 with an amplitude of 0.35 V and a time frequency f=4.445 MHz (the angular frequency $\Omega=2\pi f=2.7915\times10^7$ rad/s). This adds a phase shift $\Phi(t)=\Phi_0 \cos(\Omega t)$ to the TM component of the beam with $\Phi_0=0.85$ rad. After being collimated with a 10× objective 427, the phase modulated beam has two polarized components $$P_{10} = e^{i\phi(t)}\begin{bmatrix}1\\0\end{bmatrix}$$

(the p-polarized) and $$P_{20} = \begin{bmatrix}0\\1\end{bmatrix}$$

(the s-polarized). The beam passes through Wave plate #1 (a first wave plate 415) so that the two orthogonally polarized components are $$P_1 = \begin{bmatrix}a\\be^{i\varphi}\end{bmatrix} \text{ and } P_2 = \begin{bmatrix}b\\-ae^{i\varphi}\end{bmatrix}$$

(with $\sqrt{a^2+b^2}=1$) which emerge and form initial states of the two "counter-propagating beams" for the zero loop-area Sagnac interferometer. The beam is incident on the sample 413 at 50°. When the beam returns after passing through Wave plate #2 (a second wave plate 417) (if present) twice, it passes through Wave plate #1 again, then the PM-fiber-EOM assembly 411, 409, 407, and finally the linear polarizer 405. A portion of the returning beamwith an average power $\gamma I_{inc}=2$ μW is sent to the photo-receiver 421 with the amplitude of the electric field $$S(t) \sim [(P_2^\dagger MP_1)e^{i(\Phi(t+\tau)+\delta_{12})}+(P_1^\dagger MP_2)e^{i(\Phi(t+\tau)+\delta_{21})}+ \text{terms of other arrival times}], \quad (23)$$

where τ is the round-trip time it takes the beam to traverse from EOM 409 through the 10-m fiber 411 and optical elements that follow including the sample 413 and return back to EOM 409. The terms of other arrival times are contributions from reflection of the primary beams at various surfaces of the optical elements along the loop-wise optical path starting from the beam splitter 403 and from the transmitted beams but along "paths" with different refractive indices. These terms do not interfere with the first two terms in Eq. (23) and thus only add to the dc background of the photocurrent. The time frequency f=4.445 MHz is chosen to make $\Omega\tau=2\pi f\tau=\pi$ so that $\Phi(t+\tau)=-\Phi(t)$. $\delta_{12}$ and $\delta_{21}$ are the reciprocal phases acquired by the forward-traveling beam (P1) and the backward-traveling beam (P2) starting right after the EOM 409, respectively. The photo-receiver 421 is a 125 MHz photo-receiver (New Focus Model-1801 Newport, Calif.). The receiver 421 has a gain of $4\times10^4$ V/A and a responsivity of 0.45 Å/W at 780 nm. The optical power of the beam arriving at the photo-receiver 421 varies with time as $$I(t)=(\gamma/4)I_{inc}|(P_2^\dagger MP_1)e^{i(\Phi(t+\tau)+\delta_{12})}+ (P_1^\dagger MP_2)e^{i(\Phi(t+\tau)+\delta_{21})}|^2 \quad (24)$$

The first and second harmonics in modulation frequency are given by $$I(\Omega) = (\gamma/2)I_{inc}|P_2^\dagger MP_1|^2 J_1(2\Phi_0)\sin(\alpha_K + (\delta_{21}-\delta_{12})) \cong \quad (25)$$
$$(\gamma/2)I_{inc}|P_2^\dagger MP_1|^2 J_1(2\Phi_0)(\alpha_K+\Delta\delta_{12}),$$

$$I(2\Omega) = (\gamma/2)I_{inc}|P_2^\dagger MP_1|^2 J_2(2\Phi_0)\cos(\alpha_K + (\delta_{23}-\delta_{32})) \cong \quad (26)$$
$$(\gamma/2)I_{inc}|P_2^\dagger MP_1|^2 J_2(2\Phi_0).$$

They are measured with a phase sensitive detector 431 (i.e. an SRS844 lock-in amplifier (Stanford Research Systems, Palo Alto, Calif.)). The choice of $2\Phi_0=1.7$ rad maximizes $J_1(2\Phi_0)$ to 0.58 and yields $J_2(2\Phi_0)=0.28$. $\Delta\delta_{12}$ is the residual reciprocal phase difference acquired by the two "beams" as the Sagnac paths traversed by the two beams cannot be perfectly identical. In our present interferometer, it drifts slowly within ±7 μrad over 15 h. $\alpha_K$ is a function of the sample magnetization given by Eq. (2). It is determined experimentally from the ratio of the first harmonic I(Ω) to the second harmonic I(2Ω) through Eqs. (4), (25) and (26).

To compare the signal-to-noise ratio of different arrangements for measuring longitudinal Kerr effects, the longitudinal Kerr rotation is measured from the 32-nm Co film induced by an external magnetic field using four optical arrangements as described by Eqs. (12) (19) in Sec. III B. The reflectivities of Co at an incidence angle of 50° are $r_p\approx0.67+i0.34$ and $r_s=-0.87-i0.17$. When the amplifier noise in the photoreceiver dominates, the arrangement is expected that yields the largest I(Ω) to have the highest signal-to-noise ratio. If the variation in $\Delta\delta_{12}$ dominates the "noise" in the measurement of $\alpha_K$, the arrangement is expected that yields the largest $\alpha_K$ to be optimal. The former was found to be the case.

Figure 8A:
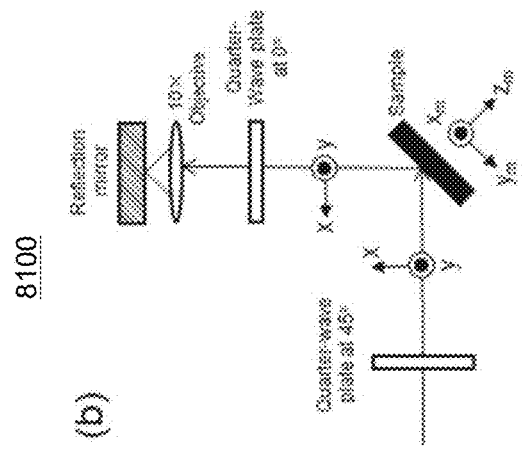
FIGS. 8A-8D are block diagrams illustrating four arrangements of the zero loop-area Sagnac interferometer in accordance with some implementations of the present disclosure.

The first arrangement is in FIG. 8A (marked as (a)) with $$P_1 = \frac{1}{\sqrt{2}}\begin{bmatrix}1\\1\end{bmatrix} \text{ and } P_2 = \frac{1}{\sqrt{2}}\begin{bmatrix}1\\-1\end{bmatrix}$$

and M given by Eq. (17) so that the longitudinal Kerr rotation is given by Eq. (18), with $$a_K = 2\theta_{K,L} = \text{Im}\left\{\frac{4\alpha_y m_y(r_p + r_s)}{r_p^2 + r_s^2}\right\}$$

and $I(\Omega) \sim |(r_p^2+r_s^2)(r_p-r_s)|$ by Eq. (19) with $\phi=0$.

Figure 8B:
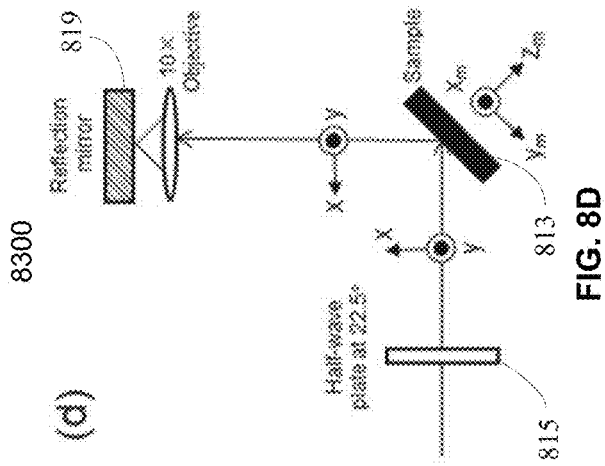

The second arrangement is shown in FIG. 8B (marked as (b)) so that $$P_1 = \frac{1}{\sqrt{2}}\begin{bmatrix}1\\i\end{bmatrix} \text{ and } P_2 = \frac{1}{\sqrt{2}}\begin{bmatrix}1\\-i\end{bmatrix}$$

and M is again given by Eq. (17). In this case, $$a_K = 2\theta_{K,L} = \text{Im}\left\{i\frac{4\alpha_y m_y(r_p - r_s)}{r_p^2 - r_s^2}\right\}$$

also from Eq. (18) and $I(\Omega) \sim |(r_p^2+r_s^2)(r_p-r_s)|$ by Eq. (19) with $(I)=\pi/2$.

Figure 8C:
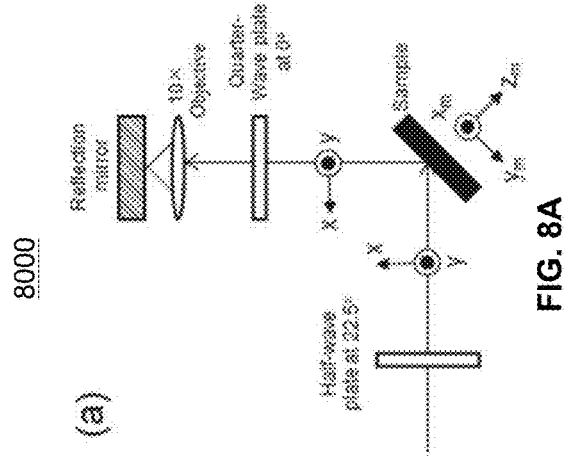

The third arrangement is illustrated in FIG. 8C (marked as (c)) so that $$P_1 = \frac{1}{\sqrt{2}}\begin{bmatrix}1\\i\end{bmatrix} \text{ and } P_2 = \frac{1}{\sqrt{2}}\begin{bmatrix}1\\-i\end{bmatrix}$$

and M is given by Eq. (14). As a result, $$a_K = 2\theta_{K,L} = \text{Im}\left\{i\frac{4\alpha_y m_y(r_p - r_s)}{(r_p^2 - r_s^2)}\right\}$$

from Eq. (15) and $I(\Omega) \sim |(r_p^2+r_s^2)(r_p+r_s)|$ from Eq. (16) with $\phi=\pi/2$.

TABLE 1

Longitudinal and transverse Kerr rotation $\theta_{K,L}$ and $\theta_{K,T}$ measured from a 32-nm Co film with five optical arrangements, the signal-to-noise ratio (SNR) (as defined in the main text), and factors in which magnitudes of $I(\Omega)$ and $\theta_K$ are proportional in different arrangements. The first four arrangements measure the longitudinal Kerr effect. The last one measures the transverse Kerr effect. Optimal arrangements for measuring Kerr rotation are highlighted in boldface.

| | $I(\Omega) \propto$ | $\theta_{K,L} \propto$ | $\theta_K$ (μrad) | SNR |
|---|---|---|---|---|
| FIG. 8A | $\|(r_p^2 + r_s^2)(r_p - r_s)]\| = 2.1$ | $\|(r_p - r_s)/(r_p^2 + r_s^2)\| = 1.24$ | 2137 | 150 |
| FIG. 8B | $\|(r_p^2 - r_s^2)(r_p - r_s)\| = 0.70$ | $\|(r_p - r_s)/(r_p^2 - r_s^2)\| = 3.8$ | 3764 | 120 |

TABLE 1-continued

Longitudinal and transverse Kerr rotation $\theta_{K,L}$ and $\theta_{K,T}$ measured from a 32-nm Co film with five optical arrangements, the signal-to-noise ratio (SNR) (as defined in the main text), and factors in which magnitudes of $I(\Omega)$ and $\theta_K$ are proportional in different arrangements. The first four arrangements measure the longitudinal Kerr effect. The last one measures the transverse Kerr effect. Optimal arrangements for measuring Kerr rotation are highlighted in boldface.

Figure 8D:
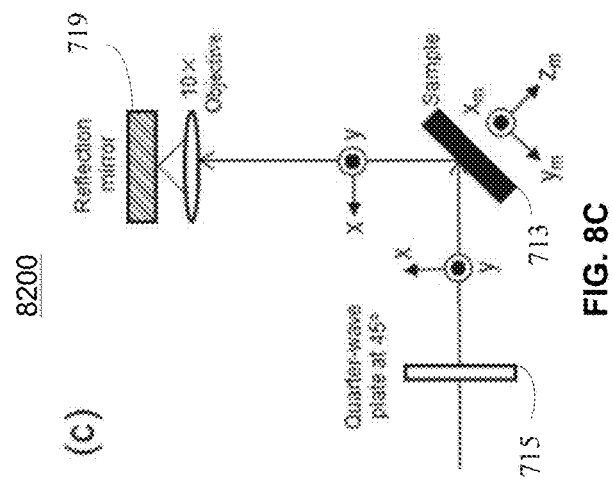

| | $I(\Omega) \propto$ | $\theta_{K,L} \propto$ | $\theta_K$ (μrad) | SNR |
|---|---|---|---|---|
| FIG. 8C | $\|(r_p^2 + r_s^2)(r_p + r_s)\| = 0.35$ | $\|(r_p + r_s)/(r_p^2 + r_s^2)\| = 1.24$ | 207 | 21 |
| FIG. 8D | $\|(r_p^2 - r_s^2)(r_p + r_s)\| = 0.11$ | $\|(r_p + r_s)/(r_p^2 - r_s^2)\| = 0.61$ | 1259 | 9 |
| FIG. 3 | $2\|r_p r_s^2\| = 1.2$ | $\theta_{K,T} \propto \|1/2r_p\| = 0.66$ | 3652 | 190 |

The fourth arrangement is illustrated in FIG. 8D (marked as (d)) so that $$P_1 = \frac{1}{\sqrt{2}}\begin{bmatrix}1\\1\end{bmatrix} \text{ and } P_2 = \frac{1}{\sqrt{2}}\begin{bmatrix}1\\-1\end{bmatrix}$$

and M is again given by Eq. (14). In this case, $$a_K = 2\theta_{K,L} = \text{Im}\left\{\frac{4\alpha_y m_y(r_p - r_s)}{(r_p^2 - r_s^2)}\right\}$$

also from Eq. (15) and $I(\Omega) \sim |(r_p^2+r_s^2)(r_p+r_s)|$ again from Eq. (16) with $\phi=0$.

FIG. 9 shows the longitudinal Kerr rotation $\theta_{K,L}=\alpha_K/2$ measured from the 32-nm Co film in the form of hysteresis loop using all four optical arrangements. The data are acquired in the single measurement with the lock-in amplifier time constant set at $\tau_{Lock-in}=1$ s. The ratio of the Kerr rotation measured at the zero magnetic field in the hysteresis loop to the standard deviation in Kerr rotation measured at the magnetic field at 250 G as the signal-to-noise ratio (SNR). Table 1 lists SNR's of the longitudinal Kerr rotation measurement for the four optical arrangements. List prefactors in which $I(\Omega)$ and $\alpha_K$ are, respectively, proportional to other than $\alpha_y m_y$. It is clear that the Kerr rotation is indeed proportional to the prefactor and has the largest value in the arrangement of FIG. 8B (marked as (b)) with $|(r_p-r_s)/(r_p^2-r_s^2)|=3.8$. Yet the SNR of the Kerr rotation measurement follows the magnitude of $I(\Omega)$ instead of $\alpha_K$. The arrangement as illustrated with FIG. 8A (marked as (a)) yields the largest $I(\Omega)$ with $|(r_p^2+r_s^2)(r_p-r_s)|=2.1$ for a Co film and the largest SNR=150. This means that the noise of our present OI ZA-SI is dominated by the amplifier noise in the photoreceiver, not the temporal variation in the residual reciprocal phase difference.

Figure 10:
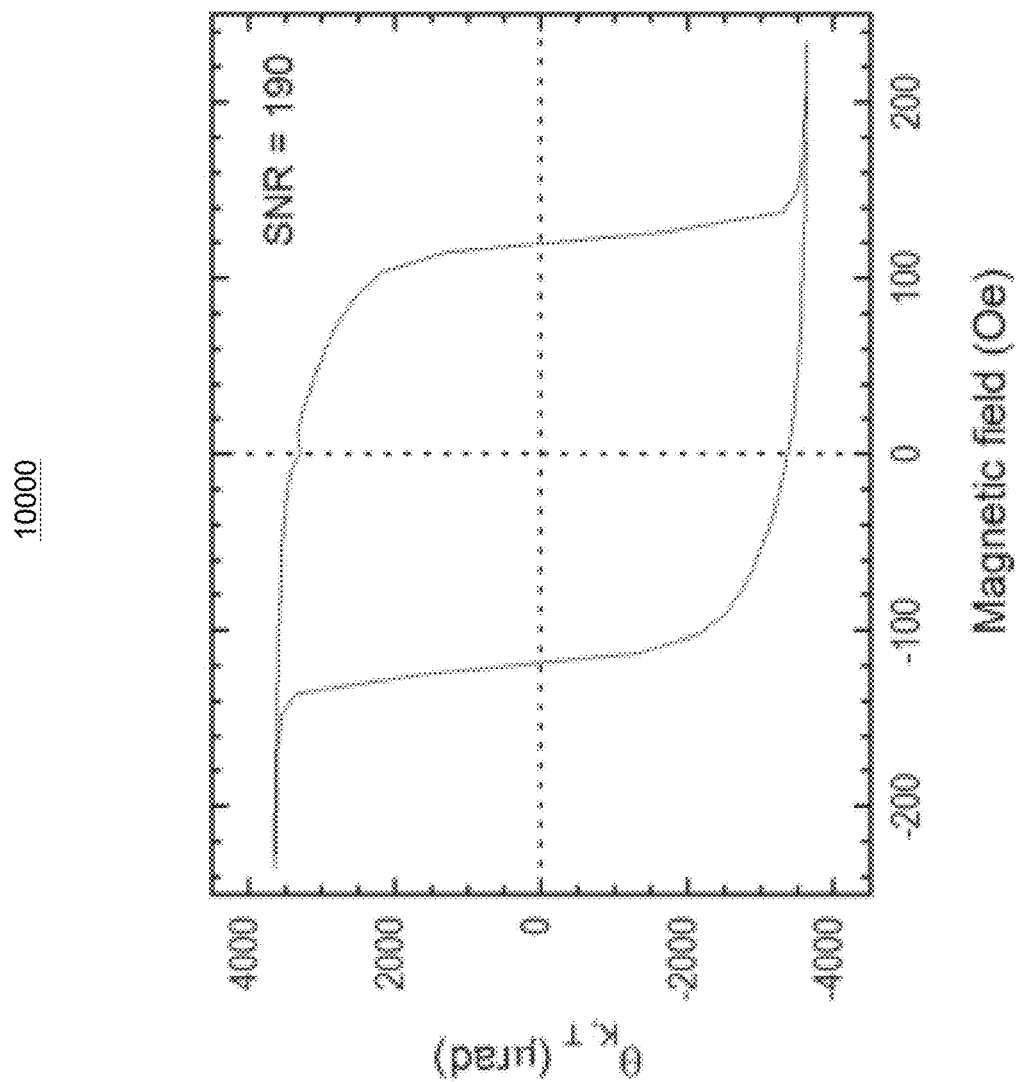
FIG. 10 is a block diagram illustrating the Transverse Kerr rotation $\theta_{K,T}=\alpha_{K,T}/2$ from a 32-nm Co film vs. applied magnetic field, acquired with the arrangement illustrated in FIG. 12.
Figure 12:
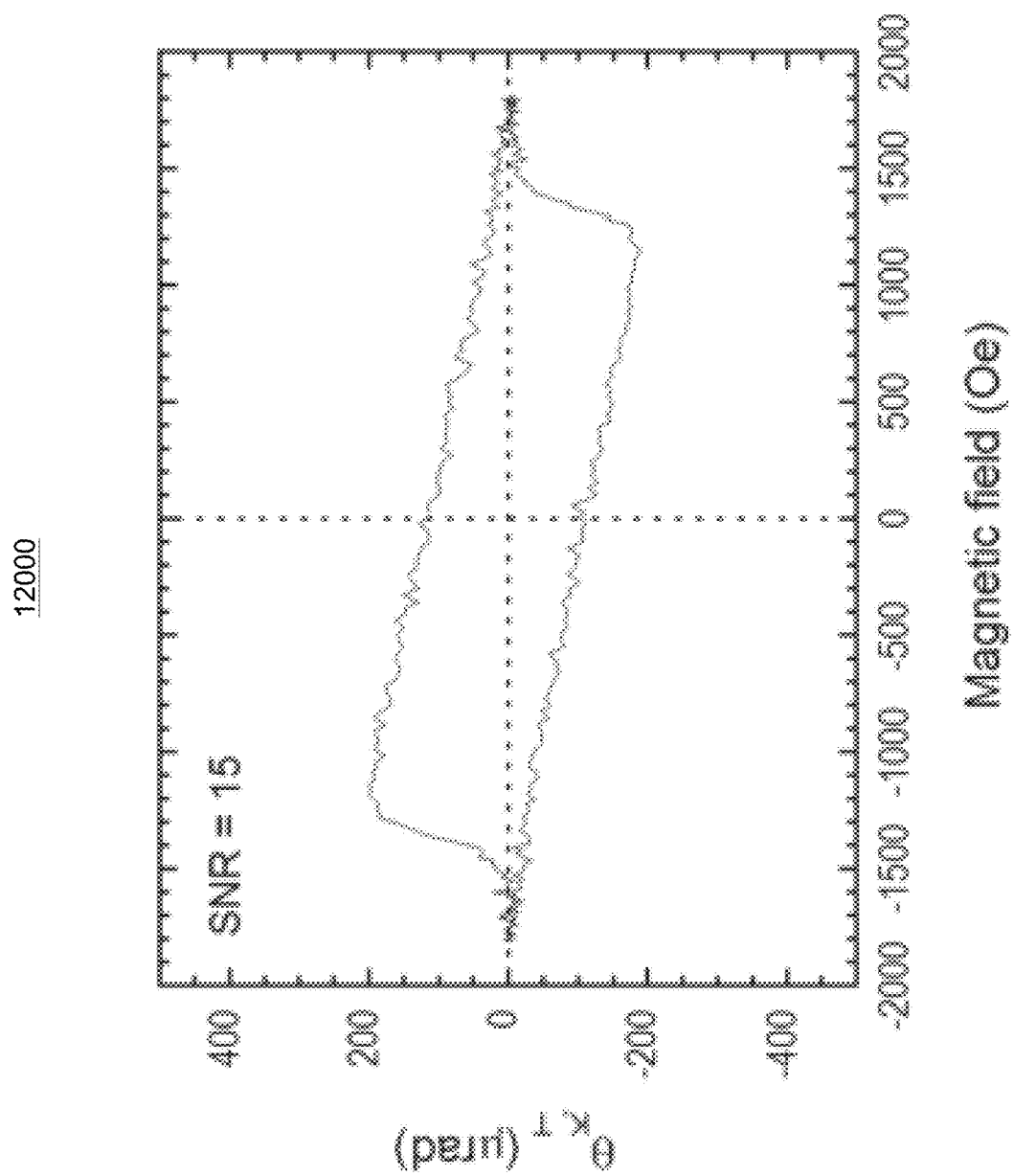
FIG. 12 is a block diagram illustrating the transverse Kerr rotation $\theta_{K,T}=\alpha_{K,T}/2$ from the (3 Å-Co/9 Å-Pd)$_{10}$ film vs. applied magnetic field along the $z_m$-axis, using the arrangement shown in FIG. 3.

To measure the transverse Kerr effect arising from the $x_m$ component of the sample magnetization (i.e., $\alpha_x m_x$), another arrangement is used by removing the half-wave before the sample 513 and setting the fast axis of the second quarter-wave plate 517 after the sample 513 set to 45° from the x-axis as shown in FIG. 12. In this case, $$P_1 = \begin{bmatrix}1\\0\end{bmatrix} \text{ and } P_2 = \begin{bmatrix}0\\1\end{bmatrix}$$

and M is given by Eq. (20), and I(Ω)∝2|$r_p r_s^2$| from Eq. (21) and $$\alpha_{K,T} = 2\theta_{K,T} = \text{Im}\left\{\frac{2\alpha_x m_x}{r_p}\right\} \propto |1/2r_p|$$

from Eq. (22). FIG. 10 displays the transverse Kerr rotation $\theta_{K,T}=\alpha_{K,T}/2$ measured from the Co film with the magnetic field applied along the $x_m$-axis (perpendicular to the plane of incidence). The data are again acquired in the single measurement with the lock-in amplifier time constant set at $\tau_{Lock-in}=1$ s. The magnitude of $\alpha_{K,T}$ and SNR are listed in the last row of Table 1 for comparison. These values of the longitudinal Kerr rotation for Co are consistent with the value reported by Qiu and Bader, after considering the fact that the value in their report was measured with a different prefactor (the combination of reflectivity coefficients) from those listed in Column 3 of Table 1.

FIG. 10 is a block diagram 10000 illustrating Transverse Kerr rotation $\theta_{K,T}=\alpha_{K,T}/2$ from a 32-nm Co film vs. applied magnetic field, acquired with the arrangement illustrated in FIG. 12. The external field is applied along the $x_m$-axis parallel to the film surface.

Figure 11:
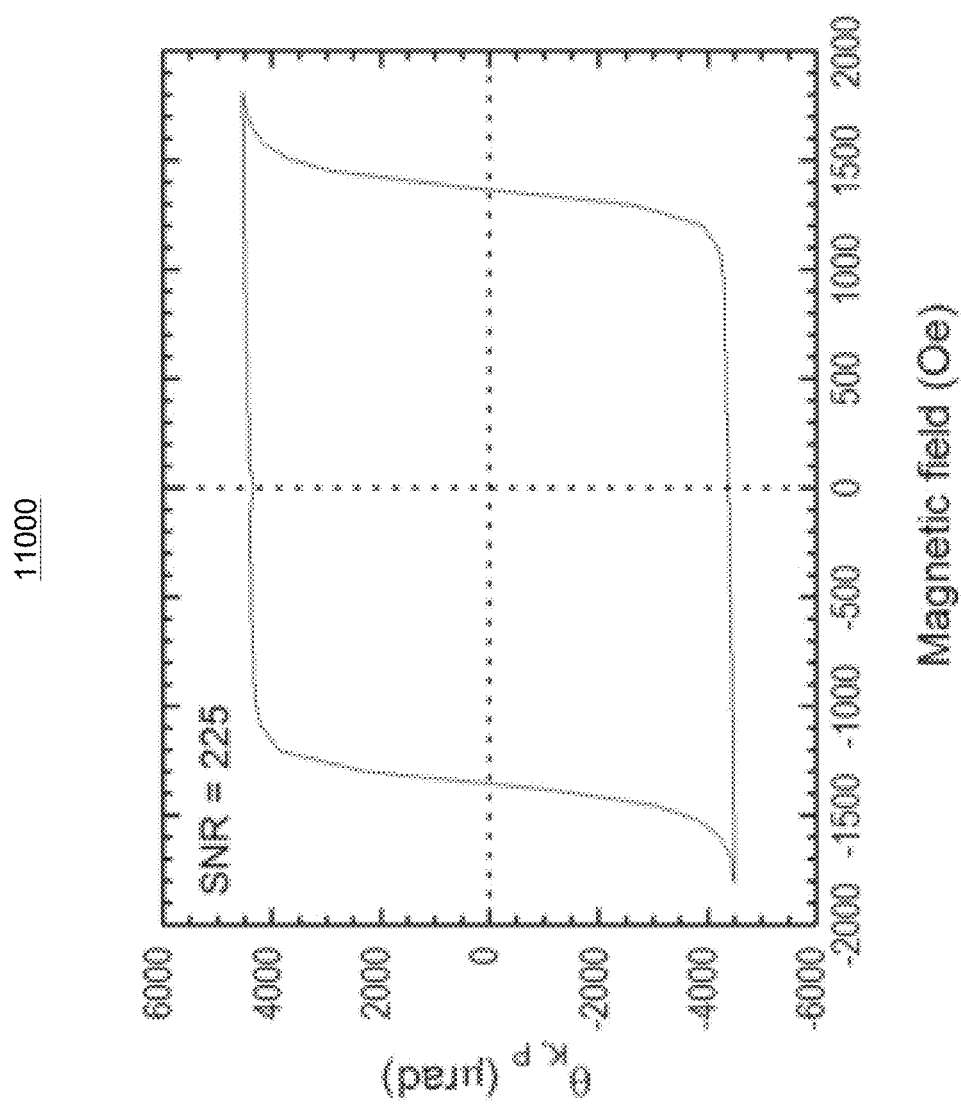
FIG. 11 is a block diagram illustrating the polar Kerr rotation $\theta_{K,P}=\alpha_{K,P}/2$ from a 12-nm film of (3 Å-Co/9 Å-Pd)$_{10}$, measured with the optical arrangement shown in FIG. 8C (marked as (c)) vs. externally applied magnetic field along the $z_m$-axis perpendicular to the film surface.

FIG. 11 is a block diagram 11000 illustrating polar Kerr rotation $\theta_{K,P}=\alpha_{K,P}/2$ from a 12-nm film of (3 Å-Co/9 Å-Pd)$_{10}$, measured with the optical arrangement shown in FIG. 10C (marked as (c)) vs. externally applied magnetic field along the $z_m$-axis perpendicular to the film surface. In this case, $P_1 = 1/\sqrt{2}[^1_i]$ and $P_2 = 1/\sqrt{2}[^1_{-i}]$ and M is given by Eq. (14).

B. Detection of Polar Kerr Effect from a [3 Å-Co/9 Å-Pd]$_{10}$ Film

To further illustrate the utility of an OI ZA-SI for detecting polar Kerr effects, the Kerr effect is measured from a [3 Å-Co/9 Å-Pd]$_{10}$ film grown on Si due to an external magnetic field applied perpendicular to the film surface. The film has an easy axis along the $z_m$-axis. A separate magnetic measurement shows that the coercive field of the [3 Å-Co/9 Å-Pd]$_{10}$ film is ~1300 Oe, within the range of our electromagnet with a pole gap of 2.5 cm. The measurement is preformed by using all four arrangements as illustrated in FIGS. 8A-8D.

The arrangement shown in FIG. 10A (marked as (a)) has $$P_1 = \frac{1}{\sqrt{2}}\begin{bmatrix}1\\1\end{bmatrix} \text{ and } P_2 = \frac{1}{\sqrt{2}}\begin{bmatrix}1\\-1\end{bmatrix}$$

and M is given by Eq. (17). It yields the polar Kerr rotation from Eq. (18) as $$a_K = 2\theta_{K,P} = \text{Im}\left\{\frac{4\alpha_z m_z(r_p - r_s)}{r_p^2 - r_s^2}\right\}$$

and I(Ω)~|($r_p^2+r_s^2$)($r_p+r_s$)| by Eq. (19) with φ=0. The arrangement in FIG. 8B (marked as (b)) has $$P_1 = \frac{1}{\sqrt{2}}\begin{bmatrix}1\\i\end{bmatrix} \text{ and } P_2 = \frac{1}{\sqrt{2}}\begin{bmatrix}1\\-i\end{bmatrix}$$

and M is again given by Eq. (17) and yields $$a_K = 2\theta_{K,P} = \text{Im}\left\{i\frac{4\alpha_z m_z(r_p - r_s)}{r_p^2 - r_s^2}\right\}$$

from Eq. (18) and I(Ω)~|($r_p^2-r_s^2$)($r_p+r_s$)| from Eq. (19) with φ=π/2. The arrangement in FIG. 10C (marked as (c)) has $$P_1 = \frac{1}{\sqrt{2}}\begin{bmatrix}1\\i\end{bmatrix} \text{ and } P_2 = \frac{1}{\sqrt{2}}\begin{bmatrix}1\\-i\end{bmatrix}$$

and M and M is given by Eq. (14) and leads to $$a_K = 2\theta_{K,P} = \text{Im}\left\{i\frac{4\alpha_z m_z(r_p - r_s)}{r_p^2 - r_s^2}\right\}$$

from Eq. (15) and I(Ω)~|($r_p^2+r_s^2$)($r_p+r_s$)| from Eq. (16) with if, =π/2. The arrangement in FIG. 10D (marked as (d)) has $$P_1 = \frac{1}{\sqrt{2}}\begin{bmatrix}1\\1\end{bmatrix} \text{ and } P_2 = \frac{1}{\sqrt{2}}\begin{bmatrix}1\\-1\end{bmatrix}$$

and M is again given by Eq. (14). It yields $$a_K = 2\theta_{K,P} = \text{Im}\left\{\frac{4\alpha_z m_z(r_p - r_s)}{r_p^2 - r_s^2}\right\}$$

from Eq. (15) and I(Ω)~|($r_p^2-r_s^2$)($r_p+r_s$)| from Eq. (16) with φ=0.

FIG. 11 shows the hysteresis loop measured with the arrangement illustrated in FIG. 8C (marked as (c)). It yields the second largest polar Kerr rotation (4500 μrad) but with the highest signal to-noise ratio (SNR=225), among the four arrangements, as expected. Table 2 lists SNR's of Kerr rotation measurements in all four optical arrangements and prefactors that I(Ω) and $\alpha_K$ are proportional to, respectively. The amplitude of the Kerr rotation has the largest value when measured with the arrangement of FIG. 8D (marked as (d)). Yet the SNR of the Kerr rotation measurement follows the magnitude of I(Ω) instead. It once again shows that in our present OI ZA-SI, the noise is dominated by the amplifier noise of the photo-receiver, not the temporal variation in the residual reciprocal phase difference.

The reversal of the magnetization in the [3 Å-Co/9 Å-Pd]$_{10}$ multilayer film induced by reversing the applied magnetic field along the $z_m$-axis is accompanied by a coherent rotation for a noticeable portion of the sample. To see this, the transverse Kerr rotation is measured using the arrangement of FIG. 3 while applying the external magnetic field only along the $z_m$-axis. The result is shown in FIG. 12.

FIG. 12 is a block diagram 12000 illustrating a transverse Kerr rotation $\theta_{K,T}=\alpha_{K,T}/2$ from the (3 Å-Co/9 Å-Pd)$_{10}$ film vs. applied magnetic field along the $z_m$-axis, using the arrangement shown in FIG. 3. In this case, P1=01 and P2=01 and M is determined by Eq. (20). This indicates that the hysteresis loop in FIG. 11 is accompanied by a coherentrotation of a portion of the magnetization through the film surface plane.

TABLE 2

Polar Kerr rotation $\theta_{K,P}$ measured from a [3 Å-Co/9 Å-Pd]$_{10}$ film with four optical arrangements, the signal-to-noise ratio (SNR) (as defined in the main text), and factors in which magnitudes of I(Ω) and $\theta_{K,P}$ are proportional in different arrangements. Since the complex refractive indices for [3 Å-Co/9 Å-Pd]$_{10}$ is not available, the magnitude of the photocurrent I(Ω) normalized to the value for the arrangement of FIG. 10C (marked as (c)) for numerical values in the second column is used.

| | I(Ω, measured)∝ | $\theta_{K,P}$∝ | $\theta_{K,P}$ (μrad) | SNR |
|---|---|---|---|---|
| FIG. 8A | \|($r_p^2 + r_s^2$)($r_p + r_s$)\| ~0.24 | \|($r_p + r_s$)/ ($r_p^2 + r_s^2$)\| | 950 | 73 |
| FIG. 8B | \|($r_p^2 - r_s^2$)($r_p + r_s$)\| ~0.19 | \|($r_p + r_s$)/ ($r_p^2 - r_s^2$)\| | 1432 | 57 |
| FIG. 8C | \|($r_p^2 + r_s^2$)($r_p - r_s$)\| ~1.0 | \|($r_p - r_s$)/ ($r_p^2 + r_s^2$)\| | 4500 | 225 |
| FIG. 8D | \|($r_p^2 - r_s^2$)($r_p - r_s$)\| ~0.27 | \|($r_p - r_s$)/ ($r_p^2 - r_s^2$)\| | 4860 | 70 |

It is showed once again that a zero loop-area Sagnac interferometer reveals the time-reversal symmetry breaking (TRSB) effect, while efficiently suppressing otherwise overwhelming birefringent effects along the Sagnac loop. More importantly, the present disclosure has demonstrated that the introduction of the oblique-incidence geometry to such an interferometer enables the detection of the TRSB effect from an arbitrarily oriented magnetization of a sample in the loop. In addition, the oblique-incidence geometry affords five optical arrangements as illustrated in FIGS. 8A-8D and 3 that take the full advantage of crystal symmetry operations, instead of just one for a normal-incidence zero loop-area Sagnac interferometer. These symmetry operations interchange the "source" and the "detector" and transform the polarization state of the forward-propagating beam to the polarization state of the backward-propagating state. As a result, one may have the option to choose one from these five arrangements to predominantly measure the Kerr effect from one Cartesian component of the sample magnetization with the highest signal-to-noise ratio while minimizing effects from the other two Cartesian components as illustrated in FIG. 9. Depending upon the dominant source of noise in the measurement of the Kerr rotation, one may choose the arrangement that yields the largest Kerr rotation angle or the one that yields the largest photocurrent at the first harmonic of the EOM modulation frequency. Using three different arrangements, one can measure the Kerr rotation from all three Cartesian components of a sample magnetization with nearly equally high signal-to-noise ratio as summarized in Tables 1 and 2. If the complex refractive index is known precisely, the ratio between the longitudinal and polar Kerr rotations can be determined in each of the four arrangements in FIG. 8 by performing measurements using these four arrangements and solving for separate contributions from the longitudinal Kerr effect and polar Kerr effect. The numerical accuracy of such determination is often not good. A more practical, accurate way of finding the ratio between the longitudinal and polar Kerr rotations is to apply a sufficiently large magnetic field to saturate the magnetization along the z-axis so that only the polar Kerr effect is at work. The sign and amplitude of the differential phase with the sample magnetization saturated along the z-axis are recorded for one calibration value. One repeats the process by applying a sufficient large magnetic field to saturate the magnetization along the y axis so that only the longitudinal Kerr effect is at work. The sign and amplitude of the differential phase with the sample magnetization saturated along the y-axis are recorded as the second calibration value. One then expresses the differential phase in general as a function of the tilt angle of the sample magnetization and these two calibration values. In this way, not only one can determine the ratio between the longitudinal and polar Kerr rotations in each of the four arrangements in FIG. 10, one can also find the tilt angle of the sample magnetization, all done without having to know refractive indices of the sample.

As to the sensitivity of the present OI ZA-SI, it is noted that the noise (the standard deviation of the measured Kerr rotation) is dominated by the amplifier noise in the photo-receiver. The input noise equivalent power of a 125 MHz photo-receiver (New Focus Model-1801 Newport, Calif.) is specified to be NEP=3.3 pW/√Hz. With a lock-in amplifier time constant set at $\tau_{Lock-in}$=1 s, the noise power is $I_n$=3.3 pW. This means that the amplifier noise in the Kerr rotation measurement is $\delta\theta_K$=In/$((\gamma/2)I_{inc}J_1(2\Phi_0))$=7 μrad, close to what observed in the present disclosure. Since the photo-receiver can take as much as 110 μW, by simply increasing the optical power returned to the receiver $\gamma I_{inc}$ to this level, one will be able to decrease the minimum detectable Kerr rotation of the present OI ZA-SI to $1.3\times10^{-7}$ rad/√Hz. If one can use the photo-receiver with an NEP=0.5 pW/√Hz, the minimum detectable Kerr rotation will be $2\times10^{-8}$ rad/√Hz. It should be pointed out that at these low levels of amplifier noise, the drift in the residual reciprocal phase difference $\Delta\delta_{12}$ and the photo shot noise need to be considered and dealt with.

Compared to oblique incidence finite loop-area Sagnac interferometers that also measure Kerr rotation from all three components of magnetization, a zero loop-area Sagnac interferometer employs two orthogonally polarized components of a single optical beam for "the two counter-propagating beams" instead of two separate beams for interferometry. As a result, it is comparatively easy to ensure that the two "beams" traverse the same Sagnac path by avoiding beam splitting and beam recombination and to make the signal much less subject to residual movements of the sample and elements in the Sagnac loop. Since a normal-incidence oblique-incidence Sagnac interferometry only measures polar Kerr effects, whereas an oblique-incidence Sagnac interferometry measures Kerr effects (longitudinal, transverse, and polar) from all three components of magnetization in a sample, the present disclosure expands the promise of the zero loop-area Sagnac interferometry.

Constraints of time-reversal symmetry on the effect of optical elements other than the sample of interest may be revisited. An oblique-incidence zero loop-area Sagnac interferometer makes it possible to study a magnetized sample without bringing optical elements to close proximity of the sample. For such a sensing application, optical beams have to pass through additional transmitting elements such as optical windows or extra fibers. The latter typically have significant birefringence due to strain or stress in the window or fiber materials. It would seem that they might render the Sagnac interferometer ineffective. Yet as long as the effects of these windows or fibers preserve the time-reversal symmetry, their Jones matrices will satisfy the general requirement specified in Eqs. (5)(7). As a result, they only affect the overall magnitude of the Kerr rotation and relative contributions from three components of the sample magnetization. If the sample is nonmagnetic, addition of these windows or extra optical fibers will not change $m_{21}=m_{12}$ as it is demanded by TRS. In practice, they can only contribute to the background through the residual reciprocal phase difference $\Delta\delta_{12}$. For the same reason, the surface morphology of a sample such as roughness and the presence of dust does not break time-reversal symmetry and thus has no effect on the differential phase as determined with Eq. (4).

A zero loop-area Sagnac interferometer is described in which optical beams interact with the sample at oblique incidence so that Kerr effects from an arbitrarily oriented magnetization in a sample can be characterized. By considering crystal symmetries allowed in such an interferometer, optimal arrangements for measuring longitudinal, transverse, and polar Kerr effects with equally high signal-to noise ratios are identified. At present, the minimum detectable Kerr rotation is only limited by the amplifier noise in the photo-receiver. By improving the optical power reaching the receiver to ~110 μW, the minimum detectable Kerr rotation can be as low as $1.3\times10^{-7}$ rad/√Hz. The simplicity and the folded Sagnac path render such an interferometer inherently stable and thus having a high sensitivity to time-reversal breaking effects in a sample as already illustrated in normal-incidence zero loop-area Sagnac interferometers.

Figure 13:
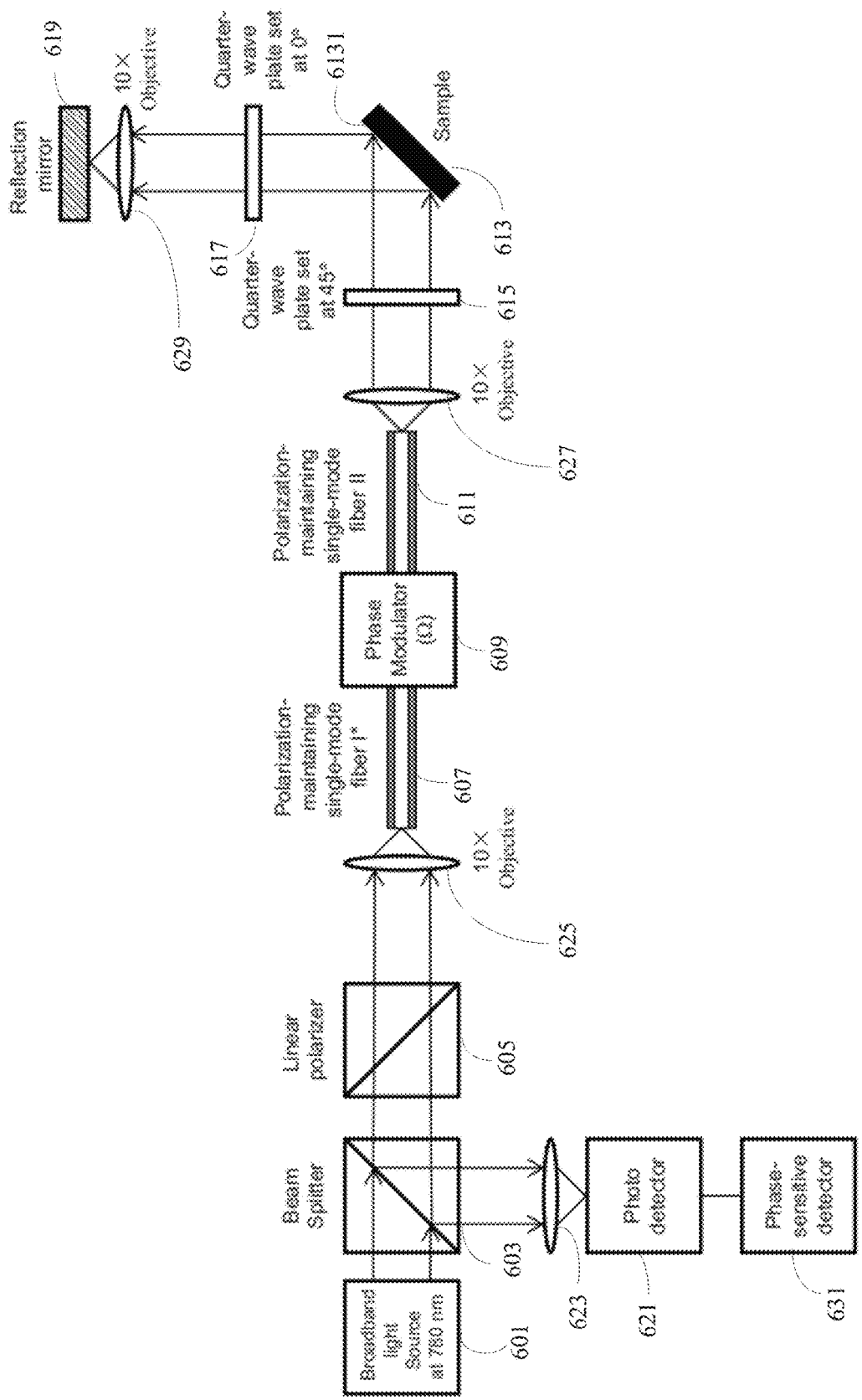
FIG. 13 is a block diagram illustrating an arrangement the same as in FIG. 8B.

FIG. 13 is a block diagram 13000 illustrating an arrangement the same as in FIG. 8B.

Figure 14:
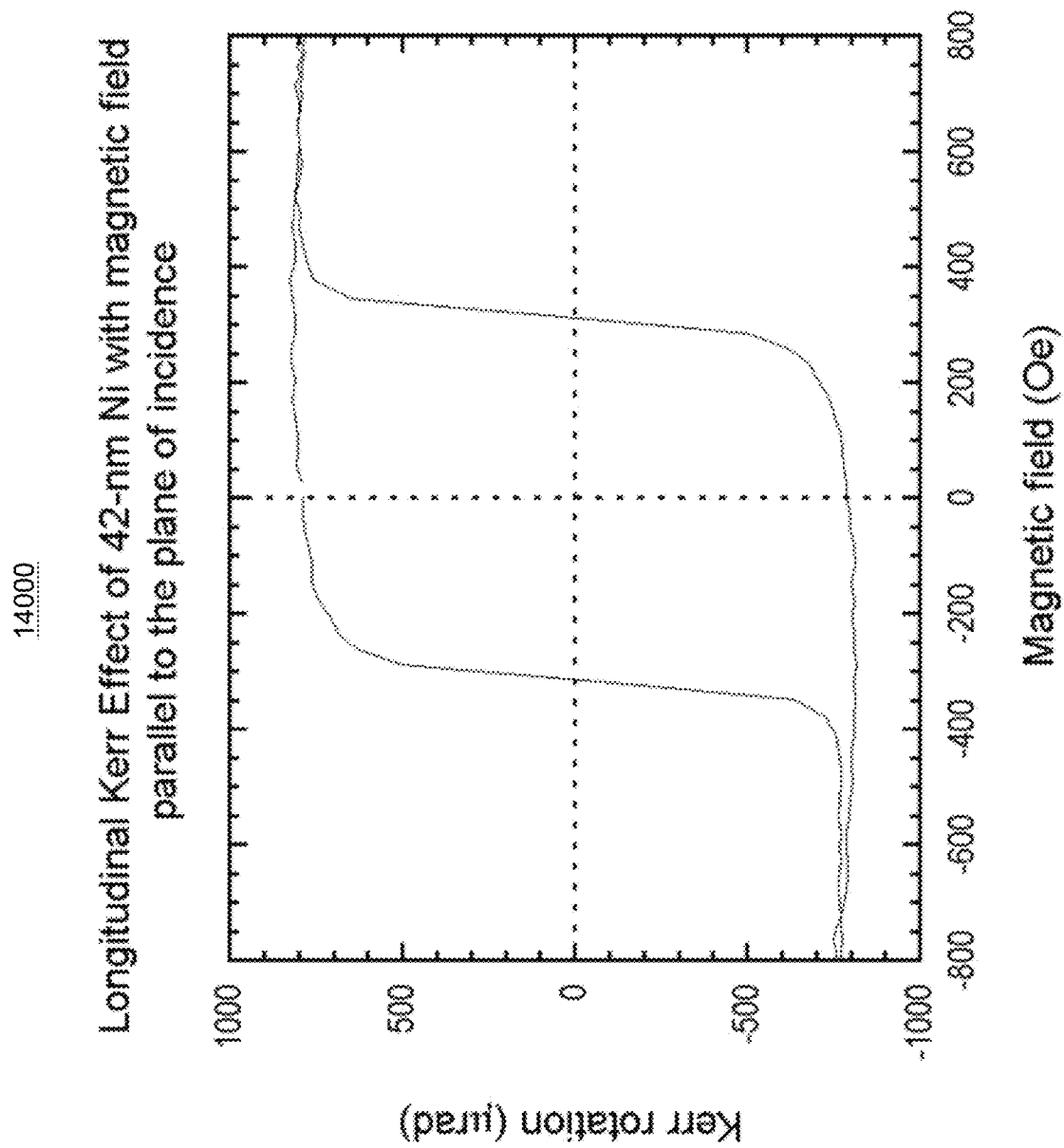
FIG. 14 is a block diagram illustrating the longitudinal Kerr effect of 42-nm Ni film with magnetic field parallel to the plane of incidence illustrated as the arrangement in FIG. 8B.

FIG. 14 is a block diagram 14000 illustrating a longitudinal Kerr effect of 42-nm Ni film with magnetic field parallel to the plane of incidence illustrated as the arrangement in FIG. 13.

Consequently, based on the disclosure as mentioned above, in some implementations, the interferometer 1000 includes a light source 101 configured to generate an optical beam; a beam splitter 103 (i.e. a 50-50 beam splitter); a polarizer 105 (i.e. a linear polarizer) configured to separate the optical beam into two orthogonal components; a modulator 109 (i.e. a phase modulator 109) configured to phase-modulating at least one of the two orthogonal components to produce a modulated pair of orthogonal components; a polarization dependent delay optics (i.e. the 1-m polarization maintaining fiber 107 or the 10-m polarization maintaining fiber 111) configured to direct the modulated pair of orthogonal components toward a surface 1131 of a sample 113 to cause the modulated pair of orthogonal components to incident on the surface 1131 at an oblique angle; a mirror 119 configured to reflecting the modulated pair of orthogonal components back towards the light source 101; a photo receiver 121 configured to receive a return beam redirected by the beam splitter 103; and a phase-sensitive detector 131.

In some implementation, the interferometer 1000, further includes a wave plate configuration configured to be used to measure longitudinal and polar Kerr, set between the sample 113 and the polarization dependent delay optics (i.e. the 1-m polarization maintaining fiber 107 or the 10-m polarization maintaining fiber 111) and between the sample 113 and the mirror 119, wherein the wave plate configuration includes one of the following:

a first quarter wave plate 615 set at 45° between the sample 613 and the polarization dependent delay optics 611, and a second quarter wave plate 617 set at 0° between the sample 613 and the mirror 619 (as shown in FIG. 8B or FIG. 13);

removing any wave plate between the sample 513 and the polarization dependent delay optics 511, and the second quarter wave plate 517 set at 45° between the sample 513 and the mirror 519 (as shown in FIG. 3);

the first half wave plate 115 set at 22.5° between the sample 113 and the polarization dependent delay optics 111, and a second quarter wave plate 117 set at 0° between the sample 113 and the mirror 119 (as shown in FIG. 1 or FIG. 8A);

the first quarter wave plate 715 set at 45° between the sample 713 and the polarization dependent delay optics (not shown), and removing any wave plate between the sample 713 and the mirror 719 (as shown in FIG. 8C); or the first half wave plate 815 set at 22.5° between the sample 813 and the polarization dependent delay optics (not shown), and removing any wave plate between the sample 813 and the mirror 819 (as shown in FIG. 8D).

In some implementations, the interferometer 1000, further includes: a first objective 125 configured to focus the two orthogonal components; a first polarization-maintaining fiber 107 configured to transmit the two orthogonal components; a second polarization-maintaining fiber 111 configured to transmit the two orthogonal components, and the polarization dependent delay optics includes the second polarization-maintaining fiber 111; a second objective 127 configured to collimate the modulated pair of orthogonal components and direct the modulated pair of orthogonal components into the sample 113; and a third objective 129 configured to focus the modulated pair of orthogonal components from the sample 113 and direct toward the mirror 119 and to collimate a return modulated pair of orthogonal components from the mirror 119.

In some implementations, the return modulated pair of orthogonal components are recombined to produce the return beam.

In some implementations, the polarizer 105 is a linear polarizer.

In some implementations, the modulated pair of orthogonal components is reflected back towards the beam splitter 103 along a same optical path.

In some implementations, the reflecting back towards the beam splitter 103 through the same path results in a zero loop-area.

In some implementations, the modulated pair of orthogonal components are rotated by $\lambda/4$ by using the wave plate configuration.

In some implementations, the phase-sensitive detector 131 is configured to detecting in-plane and out-of-plane magnetization in the sample by analyzing the photocurrent of a portion of the return beam.

In some implementations, the photo receiver 121 is a RF photo receiver and is configured to measure an intensity of a portion of the return beam.

A method of detecting magneto-optic Kerr effect 15000 in some implementations of the present disclosure, as shown in FIG. 15, includes: directing an optical beam from a light source into a polarizer to separate the optical beam into two orthogonal components; (step 1501) phase-modulating at least one of the two orthogonal components to produce a modulated pair of orthogonal components; (step 1503) directing the modulated pair of orthogonal components, using polarization dependent delay optics, towards a surface of a sample to cause the modulated pair of orthogonal components to incident on the surface at an oblique angle; (step 1505) reflecting, using an objective-and-mirror device, the modulated pair of orthogonal components back towards the light source; (step 1507) combining the modulated pair of orthogonal components to produce a modified optical beam; (step 1509) and determining a non-reciprocal phase in accordance with the optical beam and the modified optical beam. (step 1511)

The polarizer is, in some implementations, a linear polarizer.

The modulated pair of orthogonal components is, in some implementations, reflected back towards the light source along a same optical path.

The reflecting back towards the light source through the same optical path, in some implementations, results in a zero loop-area.

The method, in some implementations, further includes detecting in-plane and out-of-plane magnetizations in the sample.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components.

These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising: a light source generating an optical beam; a beam splitter; a polarizer separating the optical beam into two orthogonal polarization components; a modulator to phase-modulate at least one of the two orthogonal polarization components of the optical beam producing a modulated pair of orthogonal polarization components; polarization dependent delay optics of polarization maintaining fibers optically coupled to the modulator oriented to direct the modulated pair of orthogonal polarization components toward a surface of a sample to cause the modulated pair of orthogonal polarization components to incident on the surface at an oblique angle; a mirror positioned to reflect the modulated pair of orthogonalpolarization components back towards the beam splitter; a photo receiver to receive reflected orthogonal polarization components redirected by the beam splitter; and a phase-sensitive detector.

2. The apparatus of claim 1, further comprising:
   a first wave plate configuration set between the sample and the polarization dependent delay optics; and
   a second wave plate set between the sample and the mirror;
   wherein the first wave plate and second wave plate measure longitudinal and polar Kerr effects.

3. The apparatus of claim 2, wherein said first wave plate is a quarter wave plate set at 45° and said second wave plate is a quarter wave plate set at 0°.

4. The apparatus of claim 2, wherein said first wave plate is a half wave plate set at 22.5° and said second wave plate is a quarter wave plate set at 45°.

5. The apparatus of claim 2, wherein said first wave plate is a half wave plate set at 22.5° and said second wave plate is a quarter wave plate set at 0°.

6. The apparatus of claim 1, wherein the polarization dependent delay optics further comprise:
   a first objective lens optically coupled to a first polarization maintaining fiber; and
   a second objective lens optically coupled to a second polarization maintaining fiber.

7. The apparatus of claim 1, further comprising: a first objective lens capable of focusing the two orthogonal polarization components; a first polarization-maintaining fiber receiving and transmitting the focused two orthogonal polarization components to said modulator; a second polarization-maintaining fiberfor transmitting modulated two orthogonal polarization components from the modulator; a second objective lens positioned to collimate the modulated pair of orthogonal polarization components and direct the modulated pair of orthogonal polarization components into the sample; and a third objective lens focusing and directing the modulated pair of orthogonal polarization components from the sample toward the mirror and collimating a return modulated pair of orthogonal polarization components from the mirror.

8. The apparatus of claim 7, wherein the return modulated pair of orthogonal polarization components are recombined to produce a return beam.

9. The apparatus of claim 8, wherein the phase-sensitive detector is configured for detecting in-plane and out-of-plane magnetization in the sample by analyzing a photocurrent of a portion of the return beam.

10. The apparatus of claim 8, wherein the photo receiver is a RF photo receiver capable of measuring an intensity of a portion of the return beam.

11. The apparatus of claim 7, wherein the modulated pair of orthogonal polarization components are rotated by $\lambda/4$ by using at least one wave plate.

12. The apparatus of claim 1, wherein the polarizer is a linear polarizer.

13. The apparatus of claim 1, wherein the modulated pair of orthogonal polarization components is reflected back towards the light source along a same optical path.

14. The apparatus of claim 13, wherein the reflecting back towards the light source through the same path results in a zero loop-area.

15. The apparatus of claim 1, further comprising a quarter wave plate set at 45° between the sample and the mirror.

16. The apparatus of claim 1, further comprising a quarter wave plate set at 45° between the polarization dependent delay optics and the sample.

17. The apparatus of claim 1, further comprising a half wave plate set at 22.5° between the polarization dependent delay optics and the sample.

18. A method comprising: directing an optical beam from a light source into a polarizer to separate the optical beam into two orthogonal polarization components; phase-modulating the two orthogonal polarization components to produce a modulated pair of orthogonal polarization components; directing the modulated pair of orthogonal polarization components, using polarization dependent delay optics of a phase modulator and at least one polarization maintaining fiber, towards a surface of a sample to cause the modulated pair of orthogonal polarization components to incident on the surface at an oblique angle; reflecting, using an objective-and-mirror device, the modulated pair of orthogonal polarization components back towards the light source; combining the modulated pair of orthogonal polarization components to produce a modified optical beam; and determining a non-reciprocal phase in accordance with the optical beam and the modified optical beam.

19. The method of claim 18, wherein the polarizer is a linear polarizer.

20. The method of claim 18, wherein the modulated pair of orthogonal polarization components is reflected back towards the light source along a same optical path.

21. The method of claim 20, wherein the reflecting back towards the light source through the same optical path results in a zero loop-area.

22. The method of claim 18, further comprising detecting in-plane and out-of-plane magnetizations in the sample.

* * * * *

UNITED STATES PATENT AND TRADEMARK OFFICE
CERTIFICATE OF CORRECTION

PATENT NO. : 10,948,733 B2
APPLICATION NO. : 16/408437
DATED : March 16, 2021
INVENTOR(S) : Xiangdong Zhu Page 1 of 1

It is certified that error appears in the above-identified patent and that said Letters Patent is hereby corrected as shown below:

In the Claims

In Claim 2 (at Column 30, Line 21), please delete the word, "configuration".

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*